United States Patent [19]
Maejima

[11] Patent Number: 5,949,360
[45] Date of Patent: Sep. 7, 1999

[54] ANALOG/DIGITAL CONVERTER UTILIZING TIME-SHARED INTEGRATING CIRCUITRY

[75] Inventor: Toshio Maejima, Hamamatsu, Japan

[73] Assignee: Yamaha Corporation, Hamamatsu, Japan

[21] Appl. No.: 08/706,279

[22] Filed: Sep. 4, 1996

[30] Foreign Application Priority Data

Sep. 6, 1995 [JP] Japan .................................. 7-229471
Sep. 6, 1995 [JP] Japan .................................. 7-229472

[51] Int. Cl.⁶ .................................................. H03M 3/00
[52] U.S. Cl. ........................................ 341/141; 341/143
[58] Field of Search ................................ 341/143, 141

[56] References Cited

U.S. PATENT DOCUMENTS

| | | | |
|---|---|---|---|
| 4,972,436 | 11/1990 | Halim et al. | 375/28 |
| 5,055,843 | 10/1991 | Ferguson, Jr. | 341/143 |
| 5,068,660 | 11/1991 | Swanson et al. | 341/143 |
| 5,079,550 | 1/1992 | Sooch et al. | 341/143 |
| 5,248,971 | 9/1993 | Mandl | 341/143 |
| 5,283,578 | 2/1994 | Ribner et al. | 341/143 |
| 5,311,181 | 5/1994 | Ferguson, Jr. | 341/143 |
| 5,392,043 | 2/1995 | Ribner | 341/143 |
| 5,515,046 | 5/1996 | Mandl | 341/143 |
| 5,659,315 | 8/1997 | Mandl | 341/143 |

FOREIGN PATENT DOCUMENTS

| | | | |
|---|---|---|---|
| 0396787 | 11/1990 | European Pat. Off. | 341/143 |
| 49-079452 | 7/1974 | Japan . | |
| 3-060527 | 3/1991 | Japan . | |
| 405063576 | 3/1993 | Japan | 341/143 |
| 6-013906 | 1/1994 | Japan . | |
| WO 93/23927 | 11/1993 | WIPO . | |

Primary Examiner—Howard L. Williams
Attorney, Agent, or Firm—Pillsbury Madison & Sutro LLP

[57] ABSTRACT

An analog/digital converter where input analog signals are successively converted into digital signals under a time sharing control system; the analog/digital converter includes an integrating portion, a plurality of integrated calculus memory portions, a signal digitalizing portion, a feedback analog signal generating portion, and a switching portion. According to the disclosed analog/digital converter, input analog signals for a plurality of channels or input analog signals for highly-ordered integrating processes can be converted into digital signals without making the size of the circuit large.

6 Claims, 27 Drawing Sheets

ANALOG/DIGITAL CONVERTER UTILIZING TIME-SHARED INTEGRATING CIRCUITRY

BACKGROUND OF THE INVENTION

1) Field of the Invention

The present invention relates to an analog/digital converter, and particularly relates to a delta sigma modulation type analog/digital converter which is preferably used in the field of PCM (Pulse-Code Modulation) audio system.

2) Prior Art

In FIGS. 1 to 3, are shown the constructions of general type of delta-sigma modulation A/D converters. The A/D converter shown in FIG. 1 comprises a subtraction portion 1, an integrating portion 2, a signal digitalizing portion 3, and a feedback analog signal generating portion 4. In this A/D converter, input analog signals are converted into digital signals by conducting a first order delta-sigma modulation. In such a construction, a process for changing the integral calculus obtained in the integrating portion 2 into one bit digital signals in the signal digitalizing portion 3, and a process for generating a feedback analog signal, which is equivalent to the outputted digital signal, in the feedback analog signal generating portion 4, and a process for integrating a signal obtained by subtracting the feedback analog signal from the inputted analog signal in the integrating portion 2 are successively conducted at every predetermined sampling period. As a result of repeating these processes, one bit digital signals can be obtained which are supplied to a pulse-number modulator with the aid of the input analog signal.

FIGS. 2 and 3 show other constructions of the general type A/D converters where the order delta-sigma modulation is conducted. These A/D converters shown in FIGS. 2 and 3 also comprise a signal subtracting portion(s) 1, an integrating portion 2, a signal digitalizing portion 3, and a feedback analog signal generating portion 4. In FIG. 2, the numerical reference 5 represents an adder. As shown in FIGS. 2 and 3, in the case that the third order delta-sigma modulation is conducted, three integrating portions 2 are necessary.

In audio equipment, it is frequently required to convert analog signals for a plurality of channels into digital signals. In such a case, the corresponding number of the A/D converters to the number of the channels should be provided in a parallel manner, so that the A/D converting processes can be conducted in each of the A/D converters for each channel.

In such a case, the circuits for the signal processing system of the audio equipment become large and the price of the equipment becomes expensive. Additionally, when the circuits for the A/D converting processes for a plurality of channels are constituted of an LSI (Large Integrated Circuit), the area of the semiconductor chip of the LSI becomes large, so that the price for the LSI per se becomes expensive.

Further, in order to constitute an A/D converter where a highly-ordered delta-sigma modulation can be conducted, the same number of integrators as the number of the orders are necessary. Therefore, the size of the circuit of the A/D converter for the highly-ordered delta-sigma modulation becomes large and the price of the A/D converter becomes expensive.

The present invention has as its purpose to provide an A/D converter where analog signals for a plurality of channels can be converted into digital signals without making the size of the circuit large.

Another purpose of the present invention is to provide an A/D converter where analog signals can be converted into digital signals by highly-ordered integrating processes without making the size of the circuit thereof large.

SUMMARY OF THE INVENTION

In order to carry out the first object, the first invention of the present application provides an analog/digital converter where input analog signals for a plurality of channels are successively converted into digital signals by using a time sharing control system. The A/D converter, whose construction is shown in FIG. 4, comprises an integrating means (11) for successively processing integral calculations for each channel; a plurality of integral calculus memory means (12, 12, . . . ) for memorizing integrated calculus signals which show the integrated results for each channel; a signal digitalizing means (13) for changing the integral calculating results into digital signals for each channel and successively outputting the digital signals; a feedback analog signal generating means (14) for converting said digital signals into feedback analog signals; and a switching means (15) for initializing said integrated results obtained in the said integrating means, and for supplying the input analog signals, the integral calculus signal memorized in the integral calculus memory means and the feedback analog signals into the integrating means to conduct an integrating process, and further for supplying an integral calculus signal obtained by the integrating process into the integral calculus memory means corresponding to a relevant channel, each time the integrating process is conducted for each channel.

According to the A/D converter of the first embodiment, the integrating process for each channel is successively conducted by the integral calculating means under the time sharing control system. Under such a control, when the integral calculating processes for a plurality of channels are successively conducted, an integrating process for one channel is interrupted by an integrating processes for the other channel. However, according to the A/D converter of the first embodiment, when the integrating process for one channel is interrupted, the integral calculus signal showing the integrated result of the relevant integrating process is memorized in the integral calculus memory means 12, and when the integrating process for the relevant channel is started again, the memorized integral calculus signal is supplied to the integrating means 11, so that the integrating process for the channel is correctly carried out in spite of the fact that the integrating process for the channel is interrupted.

The first embodiment has another aspect, which is shown in FIG. 5. According to this aspect, at least two capacitors (12C) are provided in each of the integral calculus memory means (12, 12, . . . ) for memorizing the integral calculus signals . In such a construction, the switching means (15) carries out both of two processes simultaneously, one of which is to supply the integral calculus signal for the relevant channel from one of the capacitors 12C of the integral calculus memory means for the relevant channel to the integrating means, and the other one of which is to supply the integral calculus signal for the relevant channel, which is obtained from the integrating means, to the other one of the capacitors 12C for the relevant channel in the integral calculus memory means.

According to the first embodiment, it becomes possible to convert analog signals to digital signals for a plurality of channels with a small number of time slots.

The first embodiment has still another aspect, which is shown in FIG. 6. According to the aspect, the A/D converter further comprises an input switched capacitor means (16, 16, . . . ) for sampling the input analog signal at every channel. In the A/D converter, the input analog signals, which are sampled at the same timing by the input signal switched capacitor means, are successively supplied into said integrating means at every channel. Therefore, the input analog signals for a plurality of channels can be sampled and converted into digital signals at the same time.

In order to carry out the second object, the second embodiment of the present application provides an A/D converter where inputted analog signals are successively converted into digital signals by repeatedly executing a plurality of integrating processes under a time sharing control system. The A/D convertor according to the second embodiment has a construction shown in FIG. 7. The A/D converter comprises an integrating means 11) for successively repeating a plurality of integrating processes; a plurality of integral calculus memory means (12, 12, . . . ) for memorizing integral calculus signals showing the integrated results obtained in the integrating processes at every integrating process; and a switching means (13) for memorizing an integral calculus signal showing the integrated result of the integrating process at the timing that the integrating process is interrupted in the integral calculus memory means for the relevant integrating process, for initializing the integrated result of the integrating process every when the integrating process is interrupted, and for supplying the integral calculus signal for the relevant integrating process from the relevant integral calculus memory means to the integrating means every time the integrating process is executed and supplying signals in such a manner that when the relevant integrating process includes an input analog signal as an object to be proceeded there, the analog signal is supplied into the integrating means, while, when the relevant integrating process includes the result of the other integrating process as an object to be proceeded there, the integral calculus for the other integrating process is supplied from the relevant integral calculus memory means into the integrating means.

According to the A/D converter of the second embodiment, each of the integrating processes is successively executed by the integrating means 11 under the time sharing control system. In order to execute each of the integral calculating processes in a successive manner, one integrating process must be interrupted by another of the integrating process. However, according to the second embodiment, when one integrating process is interrupted, an integral calculus signal showing the integrated result of the integrating process is memorized in the integral calculus memory means 12, and when the relevant integrating process is started again, not only an analog signal, which is the original object to be proceeded there, but also an integral calculus signal, which is memorized in the memory, at the timing of the interruption are supplied into the integrating means 11, so that the relevant integrating process is correctly executed in spite of the interruption. When highly-ordered integrating processes are conducted, it is necessary to transfer the integrated result of one integrating process to the other integrating process. According to the second embodiment, the transfer is conducted via the switching means 13.

The second embodiment has another aspect, which is shown in FIG. 8. According to the aspect, the A/D converter comprises an integrating means (11) for successively executing a plurality of integrating processes; a plurality of integral calculus memory means (12, 12, . . . ) for memorizing integral calculus signals showing the integrated results of the integrating processes at every integrating process; an integral calculus transferring means (14) for transferring integral calculus between different kinds of integral processes, in which when the result of the previously conducted integrating process is included in the objects to be processed in the following integrating process, the integral calculus signal showing the integrated result of the previously conducted integrating process is memorized, and a switching means (13) in which every the integrating process is interrupted, an integral calculus signal showing the integrated result of the integrating process at the timing of the interruption is memorized in the relevant integral calculus memory means and the integrated result of the integrated process is initialized; when the result of the relevant integrating process is used in the following integrating process, the integral calculus signal showing the integrated result of the integrating process is memorized not only in the relevant integral calculus memory means but also in the integral calculus transferring means so as to supply the integral calculus signal for the relevant integrating process from the relevant integral calculus memory means to the integrating means each time the integrating process is executed; and when the integrating process includes an input analog signal as an object to be processed there, the input analog signal is supplied to the integrating means, while, when the integrated result of the previously conducted integrating process is included in the objects to be processed in the relevant integrating means, the integral calculus signal for the previously executed integrating process is supplied from the integral calculus transferring means to the integrating means.

According to the aspect of the second embodiment, the integral calculus memory means 12 is constituted by, for instance, switched capacitor circuits, etc. Such a construction is useful to guarantee that the memory content in the integral calculus memory means is reset when the integral calculus signal is read out.

That is to say, when the memory content in the integral calculus memory means is reset by reading out the integral calculus signal once, if the integral calculus is memorized only in the integral calculus memory means, the integral calculus signal is used for only one kind of integrating process, so that it is impossible to use the result of the integrating process for another integrating process. If the integral calculus signal is read out for another integrating process in such a circumference, the integral calculus signal cannot be read out again, so that the interrupted integrating process, in which the integral calculus signal is necessary, could not be re-started.

However, according to the second embodiment, when the result of the previously executed integrating process is used in the following integrating process, the integral calculus signal obtained at the time when the previous integrating process is interrupted is memorized not only in the integral calculus memory means but also in the integral calculus transferring means for transferring the integral calculus between the difference integrating processes. Then, the integral calculus signal memorized in the integral calculus memory means is used for re-starting the interrupted, previously executed integrating process while the integral calculus signal memorized in the integral calculus transferring means is used for starting the following integrating process. In this manner, since the integrated calculus transferring means is provided in the second embodiment independently from the integral calculus memory means, the highly-ordered integrating process can be conducted without causing any problem mentioned above.

DETAILED DESCRIPTION OF THE PREFERRED EMBODIMENTS

The preferred embodiments of the A/D converter according to the present invention will be explained below. It should be noted that the present invention is not limited to these embodiments and it may be possible to arbitrarily modify them within the scope of the claims.

Construction of the First Embodiment

Figure 1:
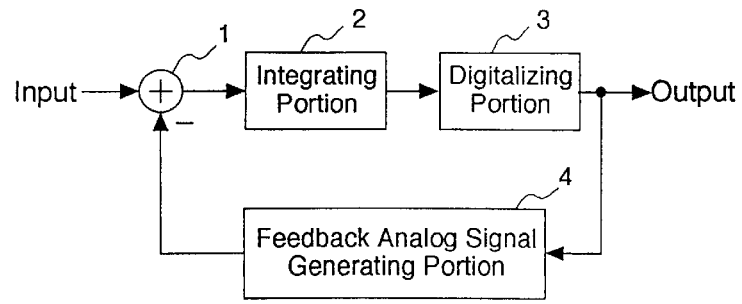
FIG. 1 is a block diagram showing a construction of the conventional delta sigma modulation type A/D converter.
Figure 2:
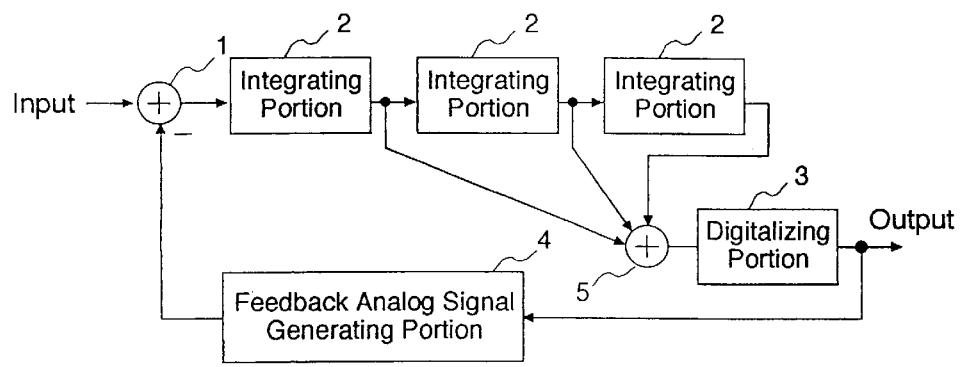
FIG. 2 is a block diagram depicting a construction of another type of conventional delta sigma modulation type A/D converter.
Figure 3:
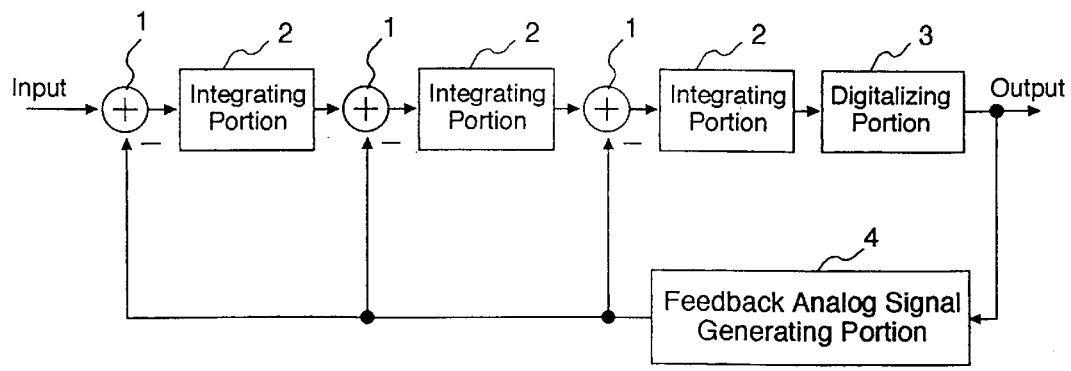
FIG. 3 is a block diagram illustrating a construction of still another type of conventional delta sigma modulation type A/D converter.
Figure 4:
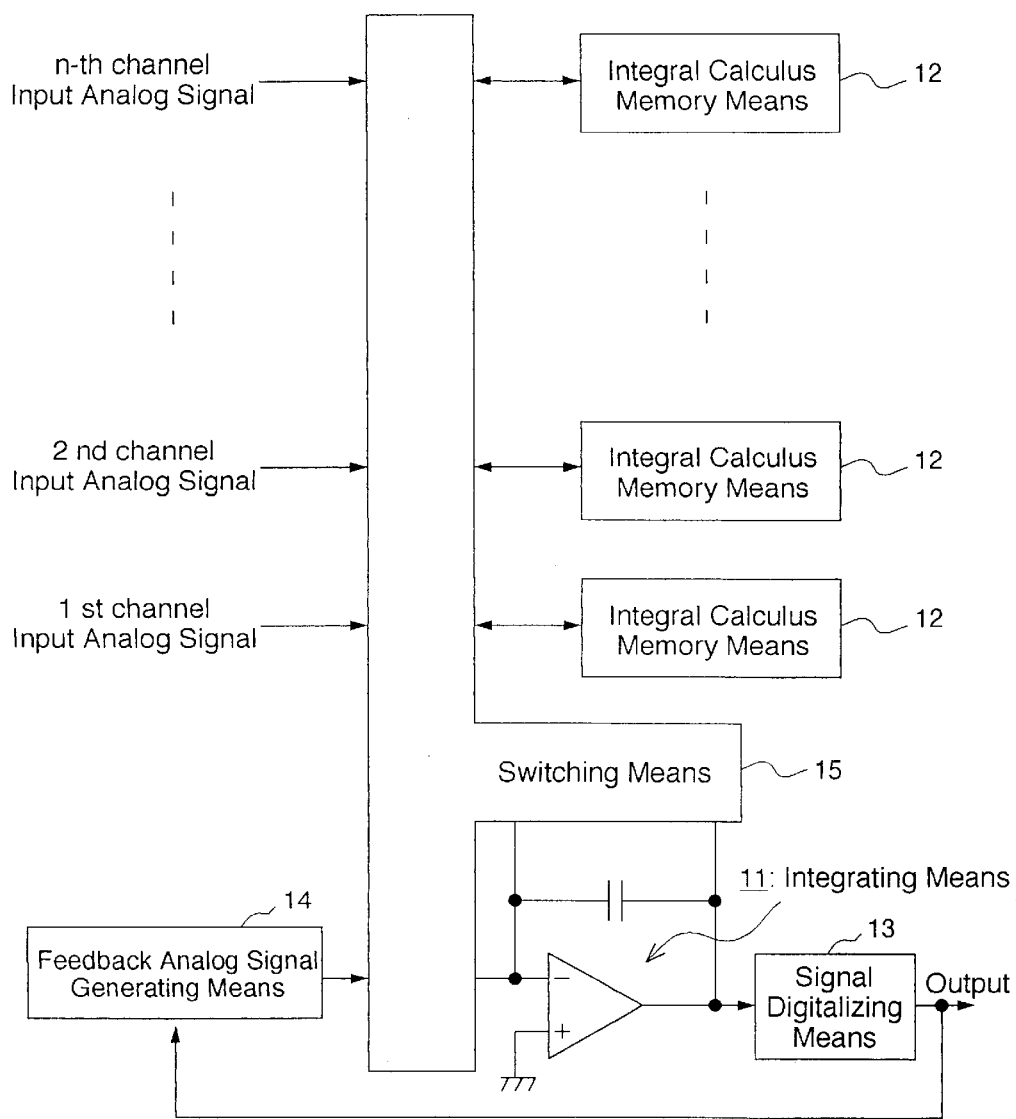
FIG. 4 is a block diagram representing a construction of the first aspect of the A/D converter according to the first embodiment.
Figure 5:
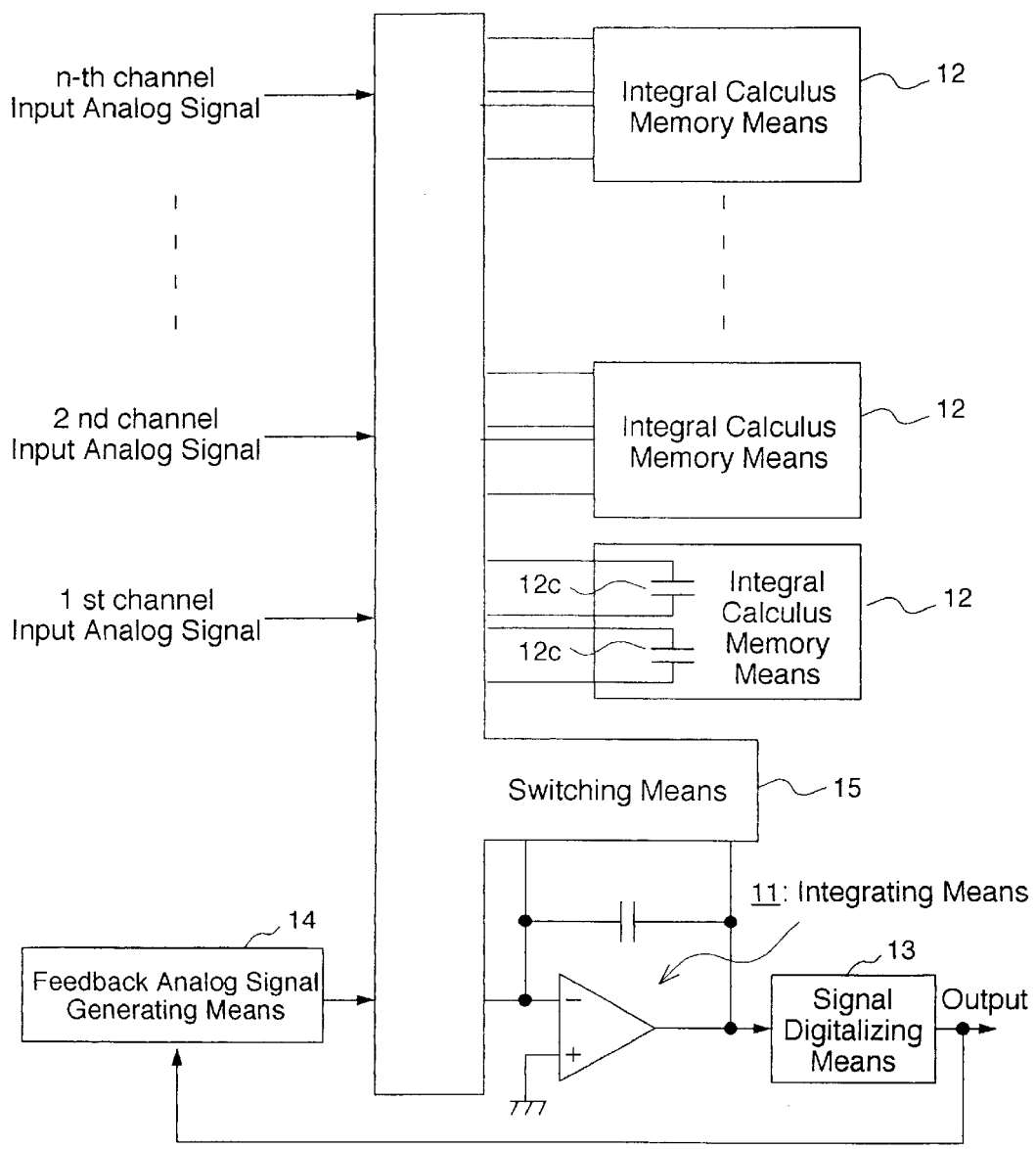
FIG. 5 is a block diagram showing a construction of the second aspect of the A/D converter according to the first embodiment.
Figure 6:
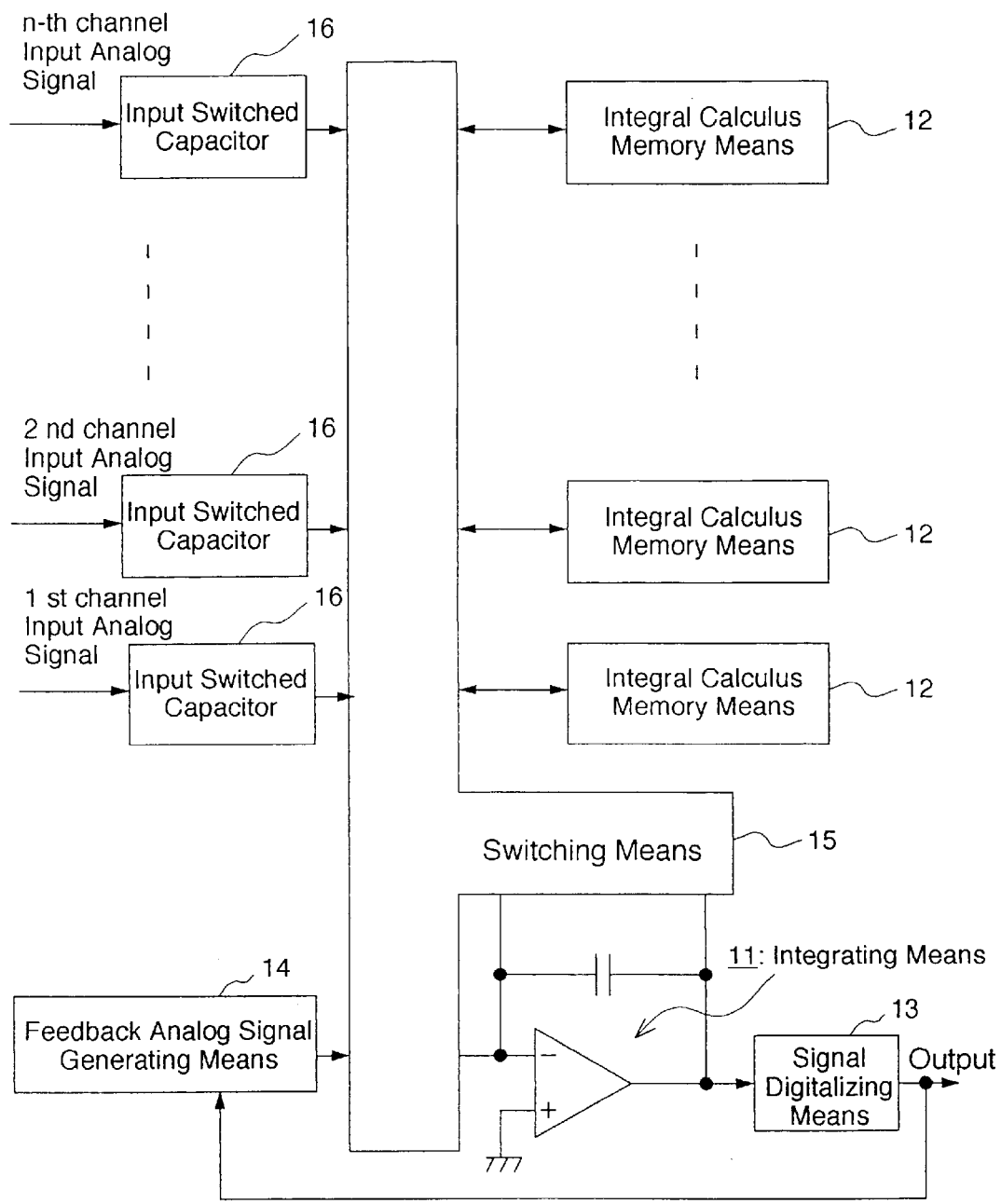
FIG. 6 is a block diagram depicting a construction of the third aspect of the A/D converter according to the first embodiment.
Figure 7:
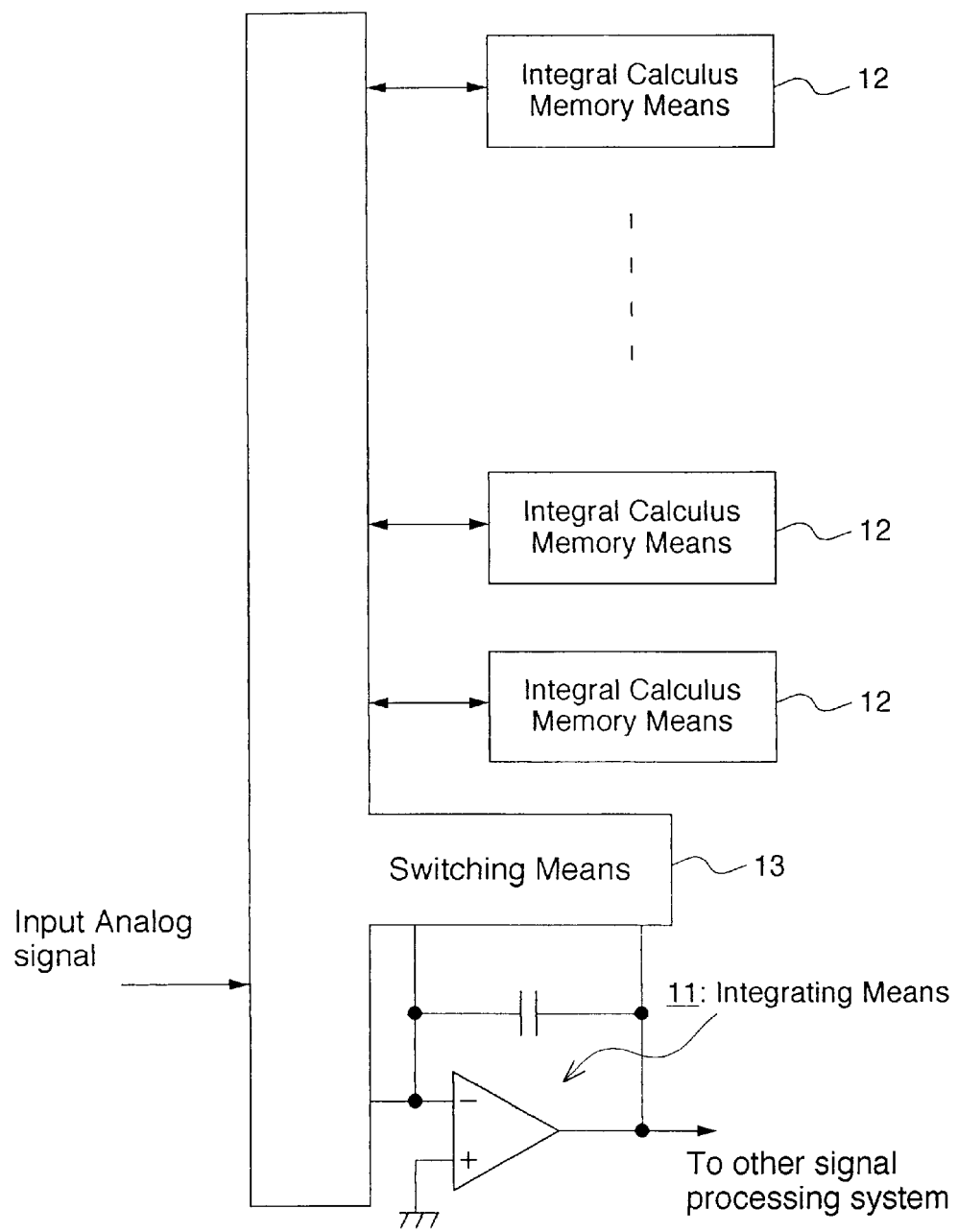
FIG. 7 is a block diagram illustrating a construction of the first aspect of the A/D converter according to the second embodiment.
Figure 8:
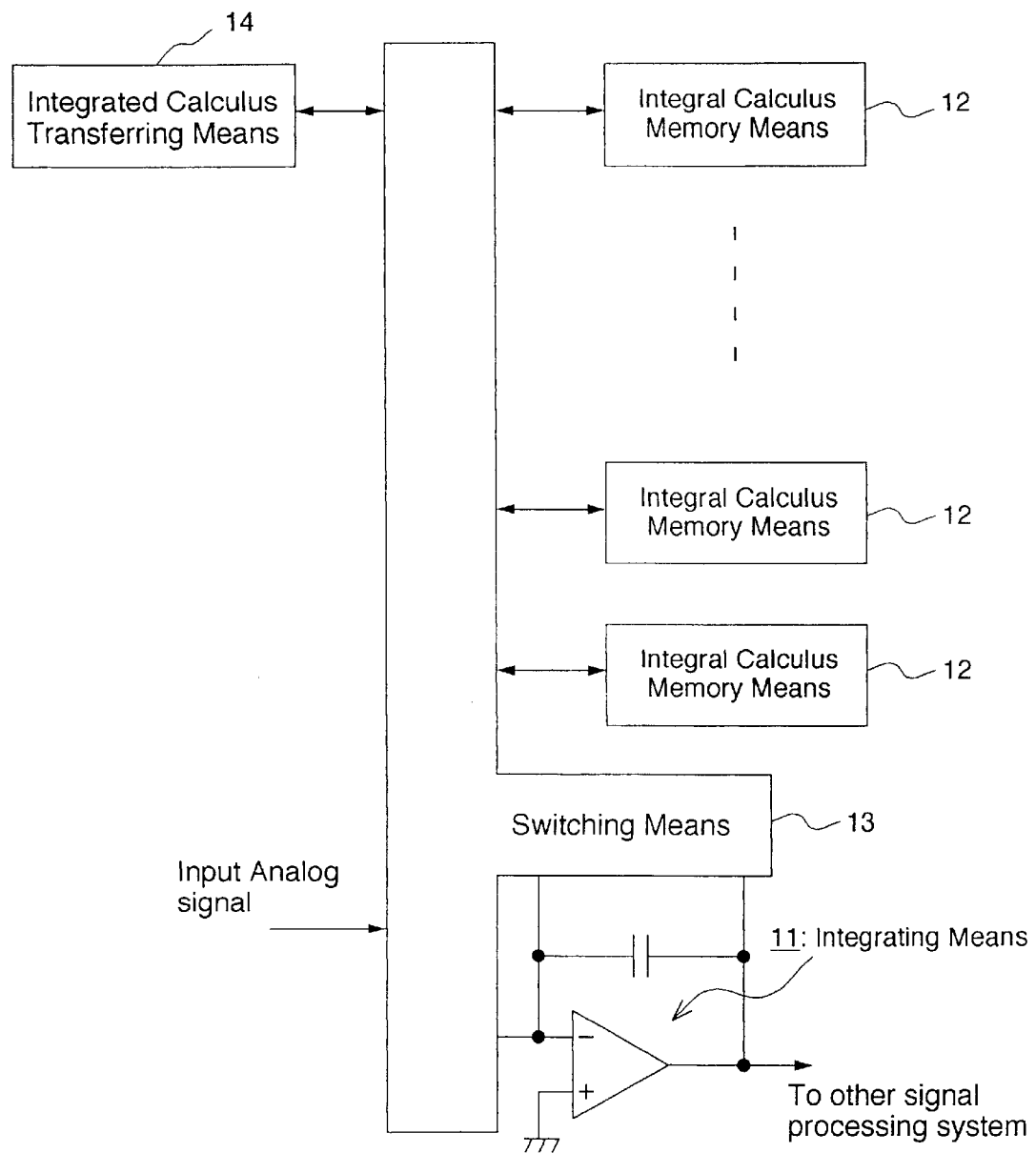
FIG. 8 is a block diagram representing a construction of the second aspect of the A/D converter according to the second embodiment.
Figure 9:
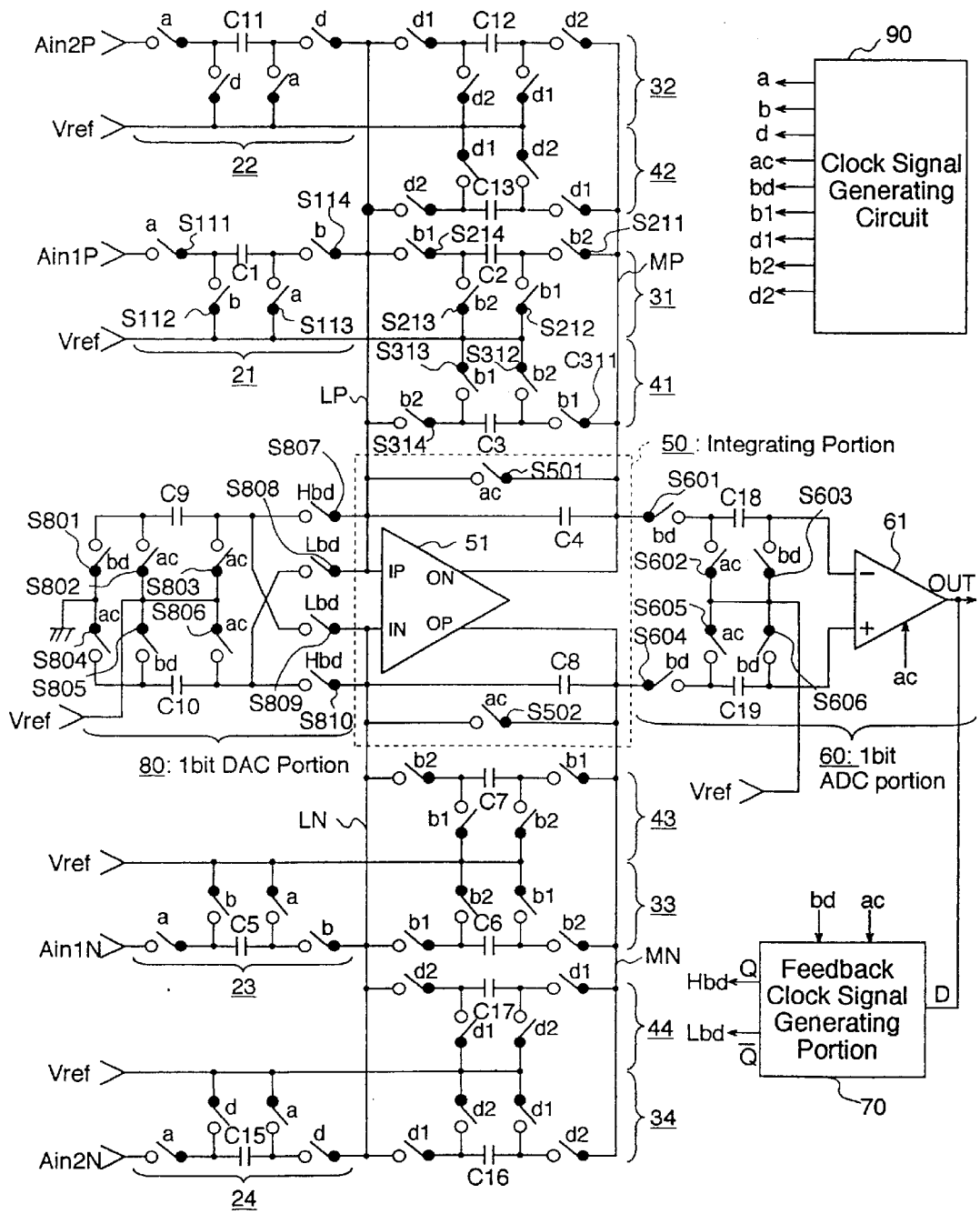
FIG. 9 is a circuit diagram showing a construction of the A/D converter according to the first embodiment of the present invention.

FIG. 9 is a block diagram showing a construction of a delta-sigma type A/D converter according to the first embodiment of the present invention. In the A/D converter, analog/digital conversions for two inputted analog signals Ain1 and Ain2 for two channels are executed in a parallel manner. These inputted analog signals are balanced signals; the inputted analog signal Ain1 for the first channel is constituted of a positive phase signal Ain1P and a negative phase signal Ain1N and the inputted analog signal Ain2 for the second channel is constituted of a positive phase signal Ain2P and a negative phase signal Ain2N.

Figure 10:
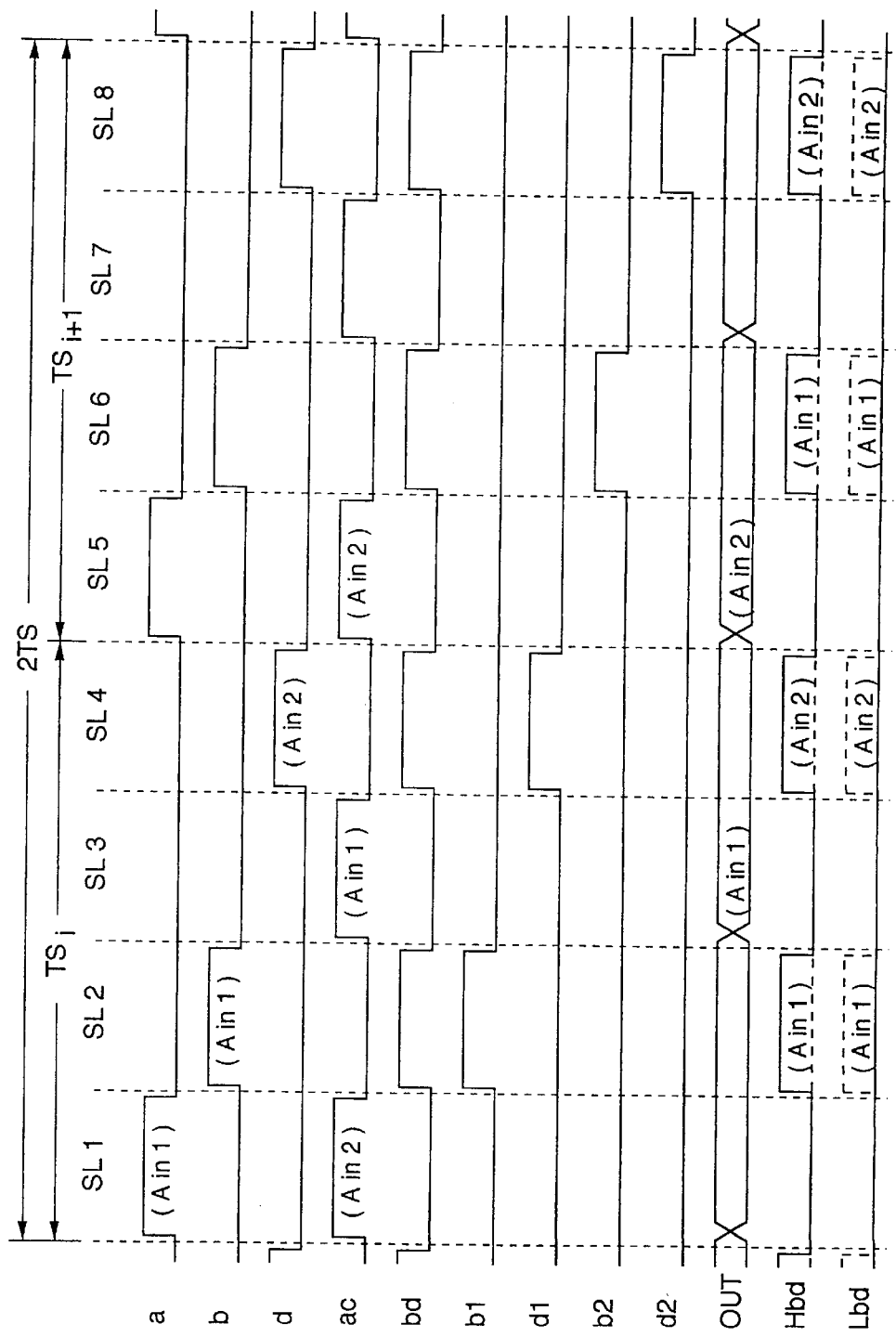
FIG. 10 is a timing chart depicting an operational condition of the A/D converter shown in FIG. 9.

A clock circuit 90 is provided for controlling operational timings of each portion of the A/D converter. From the clock circuit 90, are outputted clock signals a, b, d, ac, bd, b1, d1, b2 and d2 which are necessary to control the operational timing of the A/D converter. FIG. 10 is a timing chart depicting the wave shapes of these clock signals.

Input switched capacitor portions 21 to 24 are provided for outputting electric currents which are corresponding to the signal levels of said inputted analog signals, respectively. Out of the inputted analog signals, the positive phase signal Ain1P for the first channel is supplied to the input switched capacitor portion 21, the positive phase signal Ain2P for the second channel is to the input switched capacitor portion 22, the negative phase signal Ain1N for the first channel is to the switched capacitor portion 23, and the negative phase signal Ain2N for the second channel is supplied to the switched capacitor portion 24, respectively. The electric currents outputted from the input switched capacitor portions 21 and 22 are successively supplied to a commonly used signal line LP (hereinafter, called "positive phase input line LP"), while, the electric currents outputted from the input switched capacitor portions 23 and 24 are successively supplied to a commonly used signal line LN (hereinafter, called "negative phase input line LN").

The construction of each input switched capacitor portion will be explained. The input switched capacitor portion 21 comprises a capacitor C1 and four analog switches S111 to S114.

The analog switches S111 and S113 electrically conduct according to the clock signal a. When the switches S111 and S113 conduct, a signal path of "analog switch S111→ capacitor C1→ analog switch S113→ reference supply Vref" is formed, so that an electric charge corresponding to the signal level of the signal Ain1P is kept in the capacitor C1 via the signal path.

The analog switches S112 and S114 electrically conduct in response to the output of the clock signal b. When the switches S112 and S114 conduct, a signal path of "reference supply Vref→ analog switch S112→ capacitor C1→ analog switch S114→ positive phase input line LP" is formed, so that the electric charge kept in the capacitor C1 is supplied to the positive input line LP through the signal path.

As shown in FIG. 10, each of the clock signals a and b are alternatively outputted from the clock generating circuit 90 with a predetermined timing. Therefore, the operation that the electric charge corresponding to the signal level of the analog signal Ain1P is held in the capacitor C1 and the operation that the thus held electric charge is supplied to the positive input line LP are repeated with the predetermined timing, so that the electric current corresponding to the signal level of the analog signal Ain1P is outputted into the positive phase input line LP.

The other input switched capacitor portions 22 to 24 have the same construction as that of the switched capacitor portion 21. That is say, the portions 22 to 24 also comprise capacitors C11, C5 and C15, respectively, in each of which an electric charge corresponding to the signal level of the input analog signal is kept. Each of the switched capacitor portions 22 to 24 also comprises four analog switches, respectively, by which signal paths for applying the input analog signals to the capacitors and for outputting the electric charge kept in the capacitors to the positive input line or the negative input line are formed. However, two analog switches in the input switched capacitor portions 22 and 24 for forming the signal paths to output the electric charge kept in the capacitors to the positive input line LP or the negative input line LN are electrically conducted not by the clock signal b but by the clock signal d.

An integrating portion 50 comprises a differential amplifier 51, integrating capacitors C4 and C8, and analog switches S501 and S502, which are provided for the purpose of initialization. A non-inverting input terminal IP of the differential amplifier 51 is connected to the positive input line LP, and an inverting input terminal IN to the negative input line LN. The integrating capacitor C4 is inserted between the non-inverting input terminal IP and an inverting output terminal ON and the capacitor C8 is inserted between the non-inverting input terminal IN and the inverting output terminal OP, respectively. The inverting output terminal ON and the non-inverting output terminal OP of the differential amplifier 51 are connected to a signal line MP (hereinafter called as "positive phase output line MP") and a signal line MN (hereinafter called as "negative phase output line MN"), respectively.

According to the above-mentioned construction, signals inputted from the non-inverting input terminal IP and from the inverting input terminal IN of the differential amplifier 51 are integrated while maintaining the potential of these terminals IP and IN at the level of the reference supply Vref; all of the electric charge supplied from the positive phase input line LP is stored in the integral capacitor C4 and all of the electric charge supplied from the negative phase input Line LN is stored in the capacitor C8. As a result, a voltage corresponding to the integrated calculus is outputted between the non-inverting output terminal ON and the inverting output terminal OP of the differential amplifier 51. The output voltage, which corresponds to the integrated calculus, is separated into a positive component and negative component to be supplied to the positive output line MP and the negative output line MN, respectively.

Further, the analog switches S501 and S502 for initializing are connected to the capacitors C4 and C8, respectively, in a parallel manner. These initializing analog switches S501 and S502 electrically conduct according to the clock signals ac so that both terminals of the capacitors C4 and C8 are short-circuited to make the integral calculus zero.

In the integrating portion 50, the integral calculating process, where the input analog signal Ain1 for the first channel (=Ain1P, Ain1N) is integrated, and the other integrating process, where the input analog signal Ain2 for the second channel (=Ain2P, Ain2N) is integrated, are successively and alternatively executed under a time sharing control. In order to make possible to conduct such a time sharing control of the integrating processes, the following means A and B are provided in the present embodiment.

Means A: When the integrating process corresponding to the first channel (the second channel) is interrupted, the integral calculus is initialized to zero in the integrating portion 50 and the operation of the integrating portion 50 is transferred to the integrating process for the second channel (the first channel). The above-explained initializing analog switches S501 and S502 are provided to transfer the operation of the integrating portion 50.

Means B: When the integrating process corresponding to the first channel (the second channel) is interrupted, the integral calculus at the timing of the interruption is stored, and when the integrating process corresponding to the first channel (the second channel) is re-started, the stored integral calculus is given to the integrating portion 50 so that the integrating process is re-started from the interrupted condition. This operation is carried out by first integral calculus memory portions 31 to 34 and second integral calculus memory portions 41 to 44, which are shown in FIG. 9.

These memory portions are provided for storing signals representing the integral calculus for the respective integrating processes, which are conducted in the integrating portion 50 for both channels. That is to say, the first integral calculus memory portion 31 and the second integral calculus memory portion 41 are provided for storing the positive phase signal corresponding to the integral calculus for the first channel; the first integral calculus memory portion 32 and the second integral calculus memory portion 42 are for storing the positive phase signal corresponding to the integral calculus for the second channel; the first integral calculus memory portion 33 and the second integral calculus memory portion 43 are for storing the negative phase signal corresponding to the integral calculus for the first channel; and the first integral calculus memory portion 34 and the second integral calculus memory portion 44 are provided for storing the negative phase signal corresponding to the integral calculus for the second channel.

The construction of each integral calculus memory portion is explained below. The first integral calculus memory portion 31 comprises a capacitor C2 and four analog switches S211 to S214, in the same configuration as that of the above-mentioned input signal switched capacitor portion. The analog switches S211 and S213 electrically conduct when the clock signal b2 is given. When the switches S211 and S213 conduct, a signal path of "positive output line MP→ analog switch S211→ capacitor C2→ analog switch S213→ reference supply Vref" is formed, so that an electric charge corresponding to a positive phase component of the signal representing the integral calculus is kept in the capacitor C2. The analog switches S212 and S214 electrically conduct in response to the clock signal b1. When the switches S212 and S214 conduct, a signal path of "reference supply Vref→ analog switch S212→ capacitor C2→ analog switch S214→ positive phase input line LP" is formed; through the signal path, the electric charge held in the capacitor C2 is supplied to the positive phase input line LP under the condition that the polarity thereof is inverted. In this manner, when the clock signal b2 is outputted, the sampling of the integral calculus is conducted, and when the clock signal b1 is outputted, the electric charge, which is equivalent to the relevant integrated calculus, is supplied to the positive phase input line LP under the condition that the polarity thereof is inverted.

The second integral calculus memory portion 41 has the same construction as that of the first integral calculus memory portion 31. That is to say, the memory portion 41 comprises a capacitor C3 and four analog switches S311 to S314. However, in the second integral calculus memory 41, the signal path for applying the voltage corresponding to the positive phase component of the integral calculus to the capacitor C3 is formed when the analog switches S311 and S313 electrically conduct by the clock signal b1. Further, the signal path for supplying the electric charge held in the capacitor C3 to the positive phase input line LP is formed when the analog switches S312 and S314 electrically conduct responding to the clock signals b2.

As stated above, the clock signals b1 and b2 serve in an opposite manner in the first integral calculus memory portion 31 and in the second integral calculus memory portion 41. Therefore, when the clock signal b2 is outputted, the voltage applied on the positive phase output line MP is applied to the capacitor C2 of the first integral calculus memory portion 31; at the same time, the electric charge held in the capacitor C3 of the second integral calculus memory portion 41 is supplied to the positive phase input line LP; while, when the clock signal b1 is outputted, the voltage on the positive phase output line MP is applied on the capacitor C3 of the second integral calculus memory portion 41; at the same time, the electric charge held in the capacitor C2 of the first integral calculus memory 31 is supplied to the positive phase input line LP.

The other integral calculus memory portions have the same construction as the first integral calculus memory portion 31 and the second integral calculus memory portion 41 and work in the same manner. Namely, the other memory portions also comprise one capacitor and four analog switches, respectively. The numerical references of the capacitors and the clock signals by which each analog switch is operated, are as shown in FIG. 9.

One bit ADC (analog/digital converting) portion 60 is provided for converting the integral calculus obtained by the integral calculating portion 50 into one bit digital signals; the one bit ADC portion 60 comprises two capacitors C18 and C19, six analog switches S601 to S606 and a comparator 61.

In the one bit ADC portion 60, the analog switches S601, S603, 5604 and S606 electrically conduct responding to the clock signal bd. When these analog switches are conduct, a signal path of "positive phase output line MP analog switch S601→ capacitor C18→ analog switch S603→ reference supply Vref", and a signal path of "negative phase output line MN→ analog switch S604→ capacitor C19→ analog switch S606→ reference supply Vref" are formed. Through the former signal path, a voltage corresponding to the positive phase component of the integral calculus is applied on the capacitor C18, and through the later signal path a voltage corresponding to the negative phase component of the integral calculus is applied on the capacitor C19, respectively. When the clock signal bd goes low and the analog switches S601, S603, S604 and S606 are opened, the voltages applied in the capacitors C18 and C19 at that time are held therein. The analog switches S602 and S605 electrically conduct when the clock signal ac high. When the analog switches S602 and S605 electrically conduct, a signal path of "reference supply Vref→ analog switch S602→ capacitor C18→ inverting input terminal of the comparator 61", and a signal path of "reference supply Vref→ analog switch S604→ capacitor C19→ non-inverting input terminal of the comparator 61" are formed, respectively. Through these signal paths, the voltages held in the capacitors C18 and C19 are inverted and then supplied to the inverting input terminal and the non-inverting input terminal of the comparator 61, respectively, under the condition that the polarities thereof are inverted.

The comparator 61 has is constructed such that a general type comparator and a latch circuit are combined. In the comparator 61, when the clock signal ac is given, the input voltages at the inverting input terminal and at the non-inverting terminal thereof are compared with each other, and the compared result is outputted therefrom as a one bit digital signal "OUT". The digital signal "OUT" is supplied to a feedback clock signal generating portion 70 and to other subsequent circuitry, e.g. a digital filter, etc. (not shown).

In the feedback clock signal generating portion 70, the output digital signal of the comparator 61 is taken at a simultaneous timing with the clock signal ac. When the digital signal is "0", a clock signal Hbd is outputted from the feedback clock signal generating portion 70 at the simultaneous timing of the clock signal bd; while, if the digital signal is "1", a clock signal Lbd is outputted at the simultaneous timing of the clock signal bd.

A one bit DAC (digital/analog converting) portion 80 is provided for generating a feedback analog signal corresponding to the digital signal "OUT". The DAC portion 80 comprises capacitors C9 and C10 and analog switches S801 to S810. The analog switches S802, S803, S804 and S806 electrically conduct according to the clock signal ac. When these analog switches are conducted, both terminals of the capacitor C9 are connected to reference supply Vref and the capacitor C10 is connected between the reference supply Vref and a ground line. Therefore, each time when the clock signal ac is generated, in the capacitor C9, "0V" is kept, while in the capacitor C10 the voltage "Vref" is held, respectively. On the other hand, the analog switches S801 and S805 are conducted by the clock signal bd. As a result, one of the terminal ends of the capacitor C9 is connected to ground and from the other one of the terminal ends of the capacitor C9 is outputted a voltage "0V". Further, one of the terminals of the capacitor C10 is connected to the reference supply Vref, so that the other terminal of the capacitor C10 is outputted a voltage of "2Vref".

The analog switches S807 to S810 are provided for supplying the thus outputted voltages of the capacitors C9 and C10 into the positive phase input line LP and the negative phase input line LN as analog feedback signals, respectively. These switches electrically conduct by the clock signal Hbd or Lbd, which are generated from the feedback clock signal generating portion 70. The analog switches S807 and S810 conduct by the clock signal bd. When these switches conduct, the output voltage of the capacitor C9 (=0V) is supplied to the positive phase input line LP and the output voltage of the capacitor C10 (=2Vref) is to the negative phase input line LN, respectively. Further, the analog switches S808 and S809 electrically conduct by the clock signal Lbd. When these switches conduct, the output voltage of the capacitor C9 (=0V) is supplied into the negative phase input line LN and the output voltage of the capacitor C10 (=2Vref) is supplied into the positive phase input line LP, respectively.

Operation of the First Embodiment

The operation of the A/D converter according to the first embodiment will be explained below in accordance with the timing chart depicted in FIG. 10. In this embodiment, analog signals for two channels are sampled at every predetermined sampling period TS to convert the analog signals into digital signals. The series of the processes for the A/D conversion, is successively executed in accordance with time slots, which are determined by dividing each of the sampling period into four parts. When attention is given to the content of the processes carried out in each time slot, it will be understood that the same process is repeated at every successive eight (8) time slots, i.e. at every time period 2 TS, which corresponds to two sampling periods. Therefore, two continued sampling periods $TS_i$ and $TS_{i+1}$ are considered as one time period, and the operation of the present embodiment during the time slots SL1 to SL8, which are obtained by dividing the time period 2 TS, i.e. the sampling periods $TS_i$ and $TS_{i+1}$, into eight parts, will be explained below.

(1) Time Slot SL1

Figure 11:
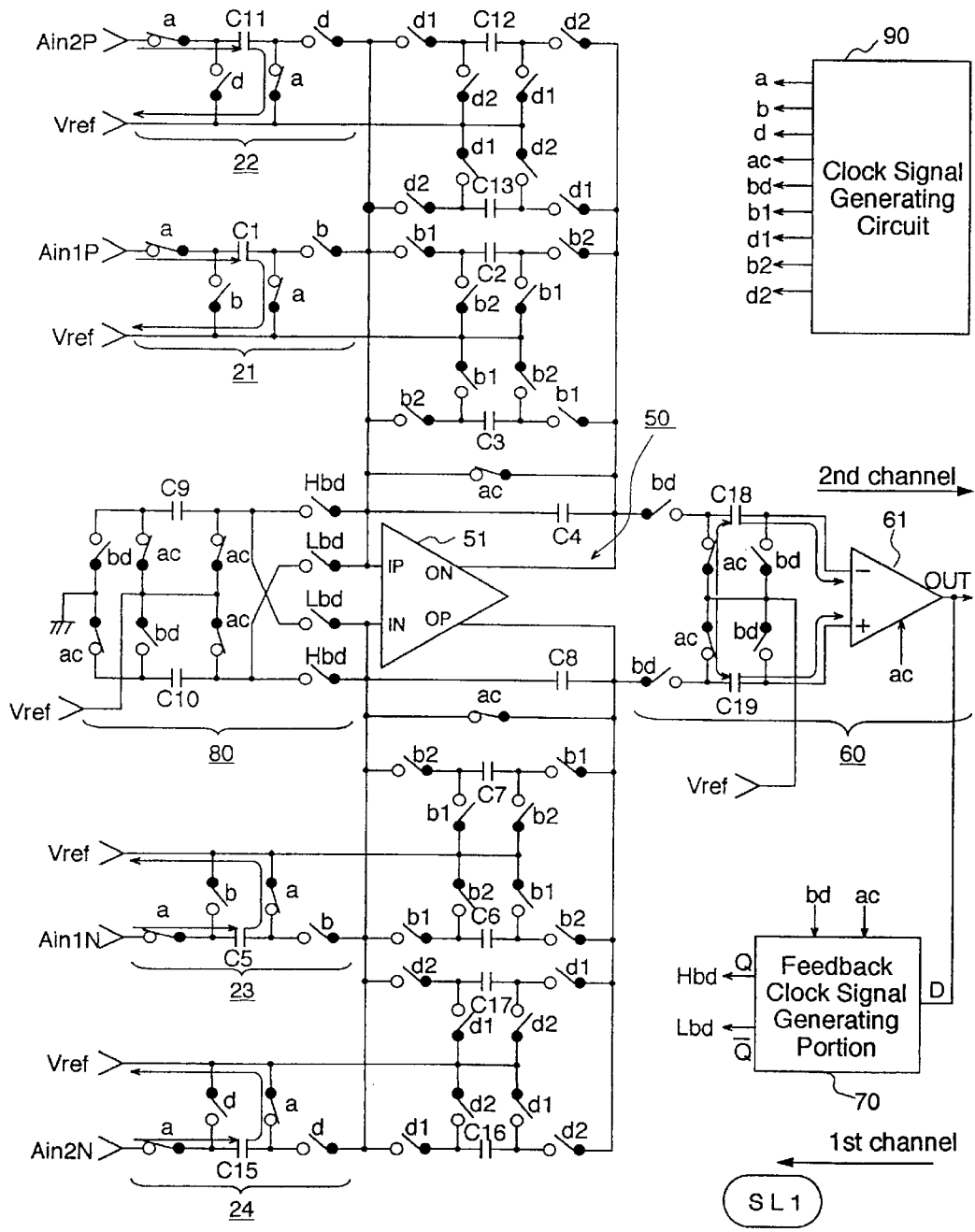
FIG. 11 is a circuit diagram illustrating an operational condition of the A/D converter shown in FIG. 9.

During the time slot SL1 of the sampling period $TS_i$, the clock signals a and ac are high, but the others are not. According to the output of the clock signal a and ac, the condition of each analog switch becomes as shown in FIG. 11, and the operation of the A/D converter is as follows.

a. In the input switched capacitor portions 21 to 24, the samplings of the input analog signals Ain1P, Ain2P, Ain1N and Nin2N are conducted, so that the electric charges corresponding to the level of the analog signals are held in the capacitor C1, C11, C5 and C15, respectively.

b. In the integrating portion 50, both terminals of each of the capacitors C4 and C8 are short-circuited, respectively, by the closed analog switches, so that the integral calculus of the integrating portion 50 becomes zero.

c. In the one bit ADC portion 60, the voltages held in the capacitors C18 and C19 are inputted into the non-inverting input terminal and the inverting input terminal of the comparator 61, respectively, to be compared to each other. The voltages held in these capacitors have been given from the integrating portion 50 during the previous sampling period $TS_{i-1}$; the voltages correspond to the integral calculus of the second channel. When the clock signal ac is outputted, the digital signal "OUT" representing the comparison result is outputted from the comparator 61.

When the integral calculus obtained from the integrating portion 50 during the previous sampling period $TS_{i-1}$ is positive, and thus the positive voltage is kept in the capacitor C18 and the negative voltage is held in the capacitor C19, the input voltage applied to the inverting input terminal of the comparator 61 becomes lower than the input voltage applied for the noninverting input terminal of the comparator 61. As a result, a digital signal "OUT" of "1" (high level) is outputted from the comparator 61. On the other hand, when the integral calculus, which corresponds to the first channel, obtained from the integrating portion 50 one sampling period before is negative, the input voltage at the inverting input terminal of the comparator 61 becomes higher than the input voltage at the non-inverting input terminal of the comparator 61, so that a digital signal "OUT" of "0" (low level) is outputted from the comparator 61. The digital signals outputted from the comparator 61 in such a manner will be taken into the feedback clock signal generating portion 70 by the clock signal ac during the following time slot SL3, which comes 2 time slots after the time slot SL1.

d. Before the digital signal for the second channel is outputted, a digital signal for the first channel is outputted from the comparator 61; the digital signal is taken into the feedback clock signal generating portion 70 by the clock signal ac during the time slot SL1.

e. In the one bit DAC converting portion 80, the voltage "OV" is kept in the capacitor C9, while the voltage "Vref" is kept in the capacitor C10.

(2) Time Slot SL2

Figure 12:
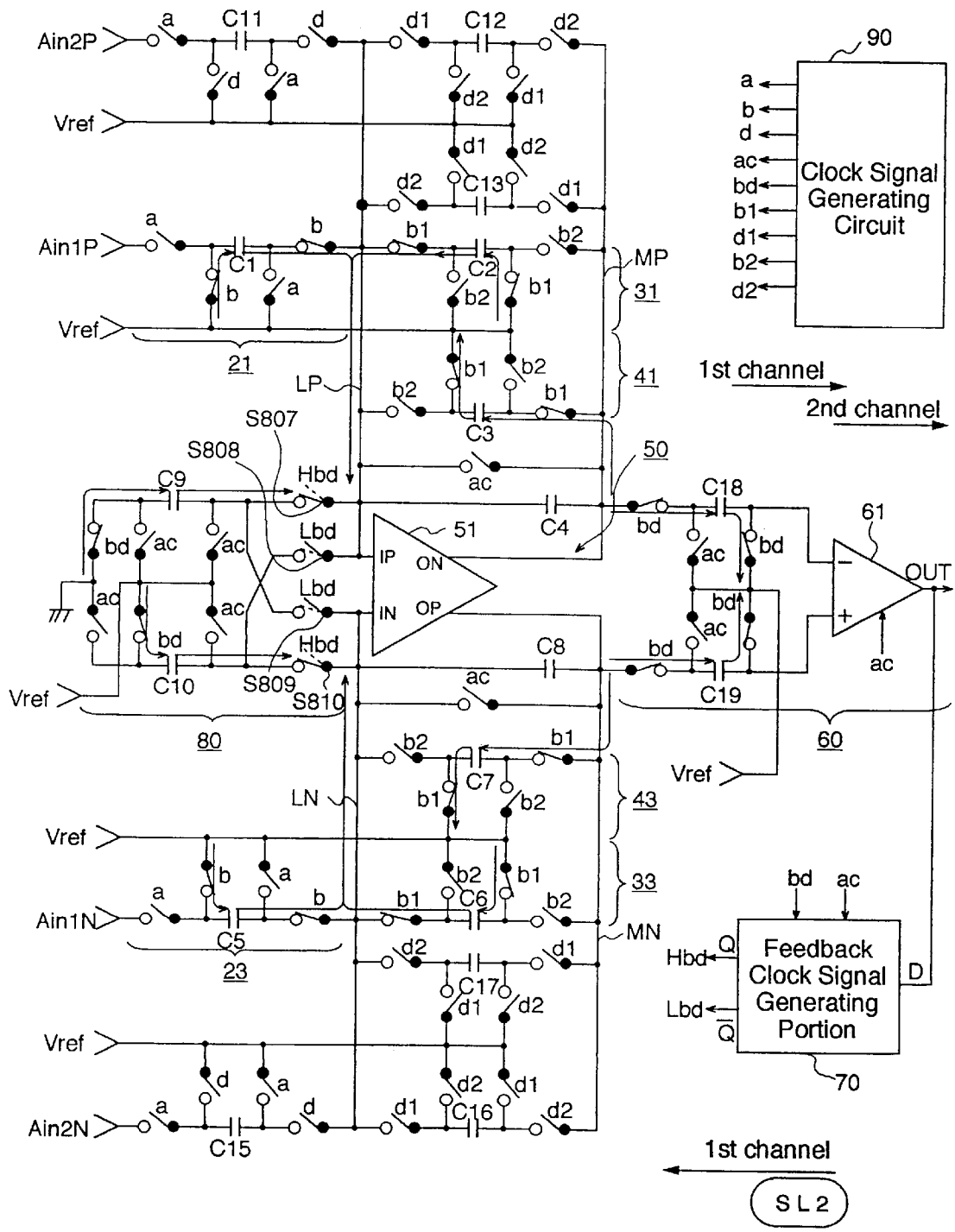
FIG. 12 is a circuit diagram representing an operational condition of the A/D converter shown in FIG. 9.

During the time slot SL2, only the clock signals b, bd and b1 are high, but the other clock signals are not. According to the output of these clock signals, the condition of the analog switches becomes as shown in FIG. 12; and the following operation is conducted in the A/D converter.

a. In the input switched capacitor portions 21 and 23, which are corresponding to the first channel, the electric charge held in the capacitors C1 and C5 are supplied into the positive phase input line LP and the negative phase input line LN, respectively, under the condition that the polarities thereof are inverted.

b. In the feedback clock signal generating portion 70, either one of the clock signals Hbd or Lbd is outputted at the simultaneous timing of the clock signal bd. Which clock signal is outputted from the portion 70 is determined by the value of the digital signal "OUT" for the first channel which has been taken into the feedback clock signal generating portion 70 during the time slot SL1. That is to say, in case the signal "OUT" is "0", the clock signal Hbd is outputted, while in case the signal "OUT" is "1" the clock signal Lbd is outputted.

c. In the one bit DAC portion 80, the voltage of "OV" is applied to the analog switches S807 and S809 from the capacitor C9, and the voltage of "2Vref" is applied to the analog switches S808 and S810 from the capacitor C10. When the digital signal "OUT" for the first channel is "0" during the previous sampling period $TS_{i-1}$, the clock signal Hbd is outputted from the feedback clock signal generating portion 70 during the time slot SL2. Therefore, the voltage of "OV" is given to the positive phase input line LP via the analog switch S807, and the voltage of "2Vref" is given to the negative phase input line LN via the analog switch S810. On the other hand, when the digital signal OUT of "1" for the first channel is outputted during the previous sampling period $TS_{i-1}$, the clock signal Lbd is outputted from the feedback clock signal generating portion 70. Therefore, the analog switches S808 and S809 electrically conduct, and the voltage of "2Vref" is applied to the positive phase input line LP and the voltage of OV is applied to the negative phase input line LN, respectively.

d. In the first integral calculus memory portions 31 and 33, the electric charges held in the capacitors C2 and C6 are supplied into the positive phase input line LP and the negative phase input line NP, respectively. The electric charges held in these capacitors, which correspond to the integral calculus for the first channel, have been given from the integrating portion 50 during the previous sampling period $TS_{i-1}$.

e. In the integrating portion 50, the initializing analog switches S501 and S502 are opened, so that the signals explained in the above-mentioned items (a), (c) and (d), which are supplied from the non-inverting input line LP and the inverting output line LN, are integrated, respectively. As a result, the integral calculus for the first channel integrated during the previous sampling period $TS_{i-1}$ is added to the input analog signal for the first channel, which has been taken during the time slot SL1, and a value obtained by subtracting the feedback analog signal from the added result is obtained as an integral calculus for the first channel of the current sampling period $TS_i$. Then, the voltage corresponding to the integral calculus is outputted to the non-inverting output line MP and the inverted output line MN, respectively, from the differential amplifier 51.

f. In the second integral calculus memory portions 41 and 43, the thus obtained electric charges, which correspond to the integral calculus for the first channel, are held. That is to say, the signal path from the positive phase output line MP to the reference supply Vref via the capacitor C3 is formed, and thus the electric charge corresponding to the positive phase component of the integral calculus is held in the capacitor C3 via the signal path. While, since the signal path from the negative phase output signal MN to the reference supply Vref is formed via the capacitor C7, the negative phase component of the integral calculus is kept in the capacitor C7.

g. In the one bit ADC portion 60, the signal path from the positive phase output line MP to the reference supply Vref via the capacitor 18 and the signal path from the negative phase output line MN to the reference supply Vref via the capacitor C19 are formed. As a result, the voltage corresponding to the positive phase component of the integral calculus, which is obtained in the integrating portion 50, is held in the capacitor C19 and the negative phase component thereof is held in the capacitor C19.

(3) Time Slot SL3

Figure 13:
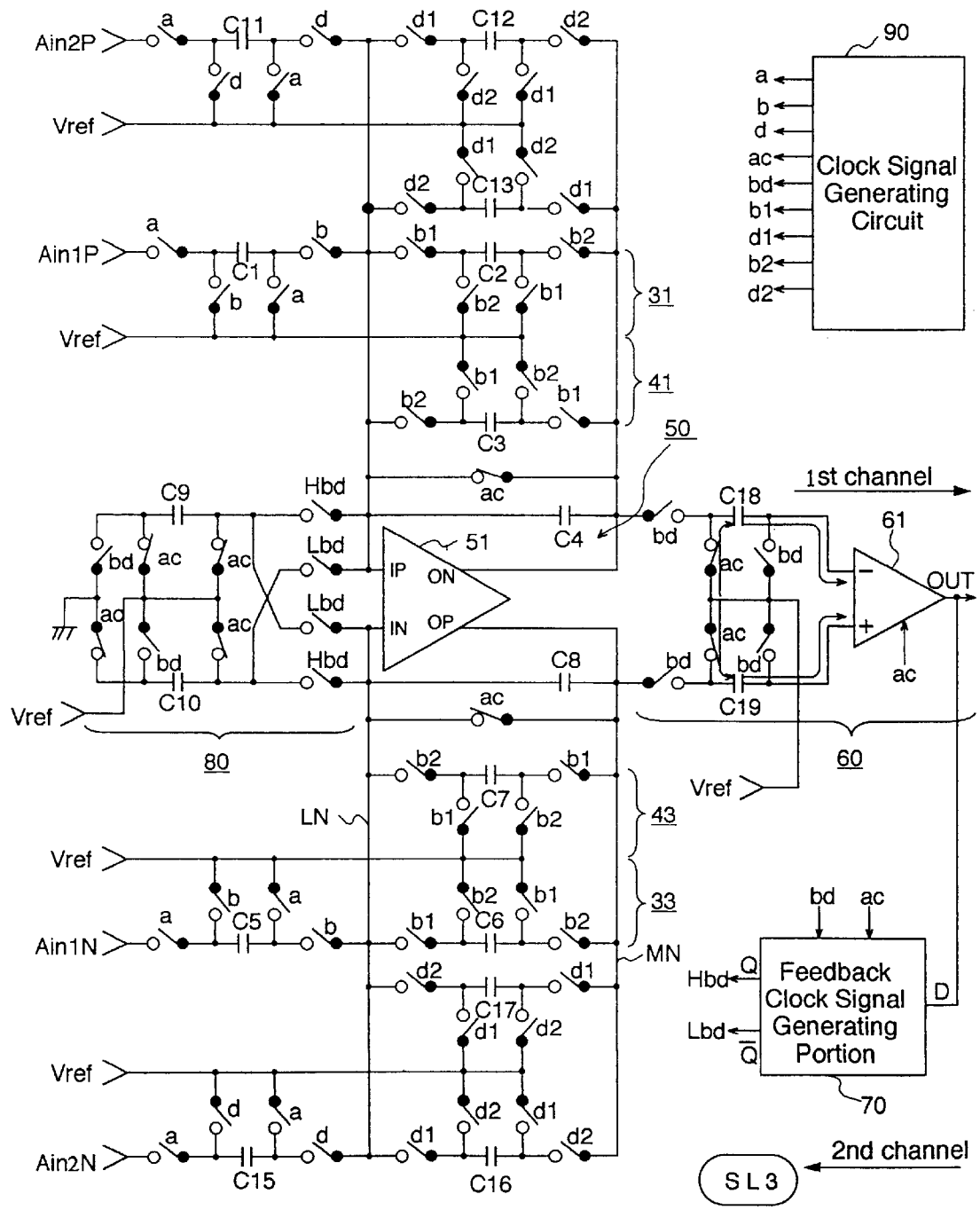
FIG. 13 is a circuit diagram illustrating an operational condition of the A/D converter shown in FIG. 9.

During the time slot SL3, only the clock signal ac is high, but the other clock signals are not. According to the clock signal ac, the condition of the analog switches becomes as shown in FIG. 13, and the following operation is conducted in the A/D converter.

a. In the one bit ADC portion 60, the voltages kept in the capacitors C18 and C19 are applied to the inverting input terminal and non-inverting input terminal of the comparator 61 as for the above-mentioned time slot SL1. In this case, input voltage applied to the comparator 61 becomes the same as the voltage corresponding to the integral calculus for the first channel, which is held in the capacitors of C18 and C19 during the time slot SL2, but the polarities thereof are inverted. Therefore, if the integral calculus for the first channel obtained in the time slot SL2 is positive, a one bit digital signal "1" (high level) is outputted from the comparator 61, and if the integral calculus is negative, a one bit digital signal "0" (low level) is outputted. The digital signal "OUT" for the first channel, outputted from the comparator 61 in such a manner, will be taken in the feedback clock signal generating portion 70 according to the clock signal ac which is generated during the coming time slot SL5.

b. The digital signal for the second channel, which has been outputted before the above-stated digital signal for the first channel is outputted, is taken in the feedback clock signal generating portion 70 according to the clock signal ac.

c. In the integral calculating portion 50, the initializing analog switches S501 and S502 electrically conduct, so that the integrated calculus thereof becomes zero.

d. In the one bit DAC portion 80, the voltage applied between the both terminals of the capacitor C9 becomes "zero" while the voltage between the both terminals of the capacitor C10 is set at "Vref".

e. In the second integral calculus memory portions 41 and 43, all of the analog switches are opened. Therefore, the electric charges given in the time slot SL2 are kept as they are in the capacitors C3 and C7.

(4) Time Slot SL4

Figure 14:
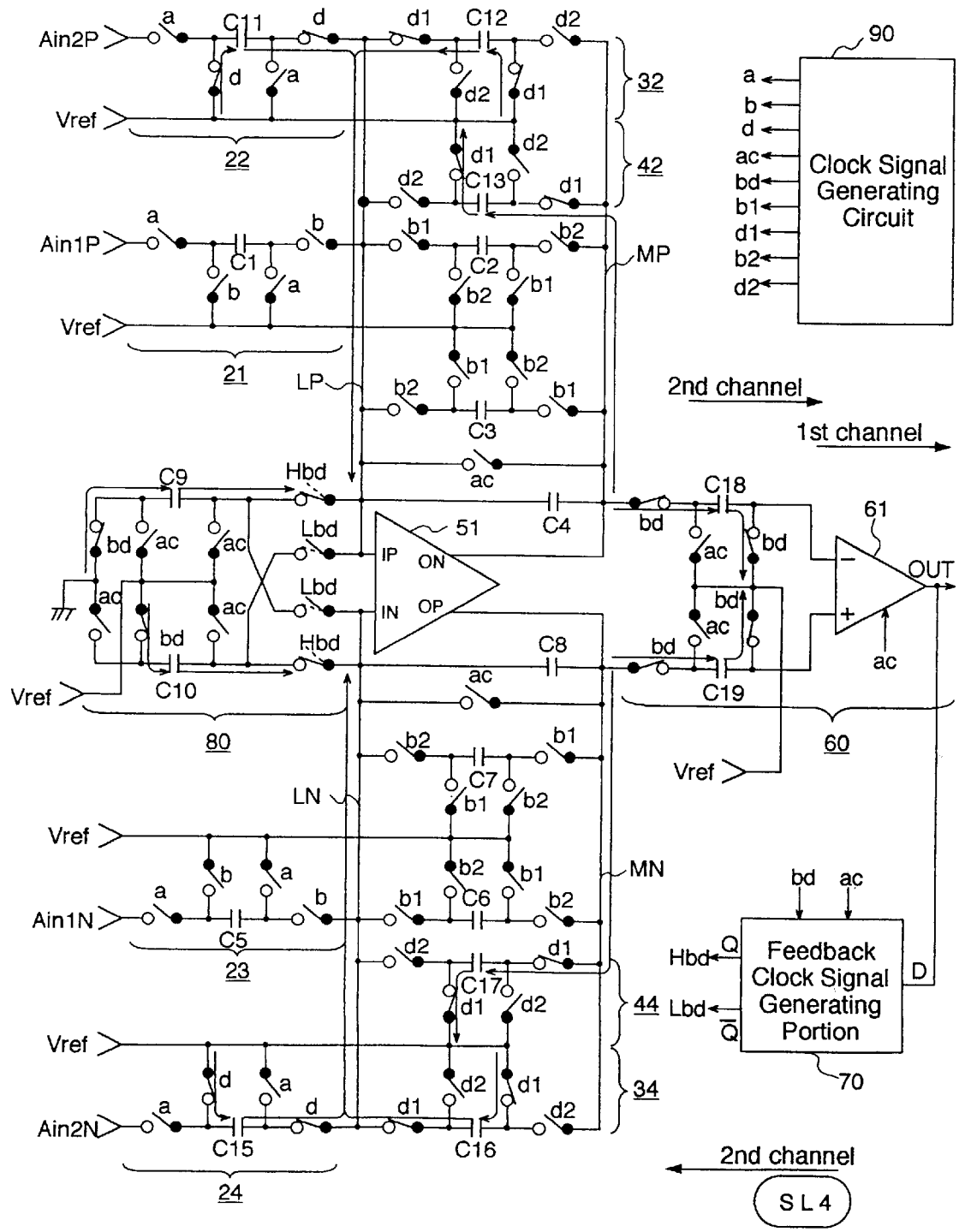
FIG. 14 is a circuit diagram representing an operational condition of the A/D converter shown in FIG. 9.

During the time slot SL4, only the clock signals d, bd and d1 are high, but the other signals are not. Therefore, according to the outputs of the clock signals, the condition of the analog switches becomes as shown in FIG. 14 and the following operation is conducted in the A/D converter.

a. In the switched capacitor portions 22 and 24 for the second channel, the electric charges held in the capacitors C11 and C15 are supplied to the positive phase input line LP and the negative phase input line LN, respectively, under the condition that the polarities thereof are inverted.

b. From the feedback clock signal generating portion 70, either one of the clock signals Hbd or Lbd is outputted at a simultaneous timing of the clock signal bd. That is to say, when the digital signal for the second channel, which has been taken in the feedback clock signal generating portion 70 during the prior time slot SL3, is "0", the clock signal Hbd is outputted, while, when the digital signal is "1", the clock signal Lbd is outputted.

c. In the one bit DAC portion 80, according to the clock signal Hbd or Lbd, a feedback analog signal corresponding to the digital signal for the second channel is generated and the signal is given to the positive phase input line LP and the negative phase input line LN, respectively. Since the detail of the operation is the same as the explanation for the time slot SL2, the explanation therefor will be omitted here.

d. In the first integral calculus memory portions 32 and 34, each electric charges held in the capacitors C12 and C16 are supplied to the positive phase input line LP and the negative phase input line LN, respectively, under the condition that the polarities thereof are inverted. The electric; charges held in the capacitors correspond to the integral calculus for the second channel obtained in the previous sampling period $TS_{i-1}$.

e. In the integrating portion 50, the signals supplied from the positive input line LP and the negative input line LN are integrated. As a result, the integral calculus for the second channel obtained in the previous sampling period $TS_{i-1}$ is added to the input analog signal for the second channel, which has been taken during the time slot SL1, and a value which is obtained by subtracting the feedback analog signal from the adding result is obtained as an integral calculus for the second channel during the sampling period $TS_i$, so that the voltage corresponding to the thus obtained integrated calculus is outputted from the differential amplifier 51 to the positive phase output line MP and the negative phase output line MN, respectively.

f. In the second integral calculus memory portions 42 and 44, the electric charge corresponding to the thus obtained integral calculus for the second channel is held in the capacitors C13 and C17.

g. The voltages corresponding to the positive phase component and the negative phase component of the integral calculus for the second channel are supplied from the integrating portion 50 into the one bit ADC portion 60. These voltages are held in the capacitors C18 and C19 provided in the one bit ADC portion 60.

(5) Time Slot SL5

Figure 15:
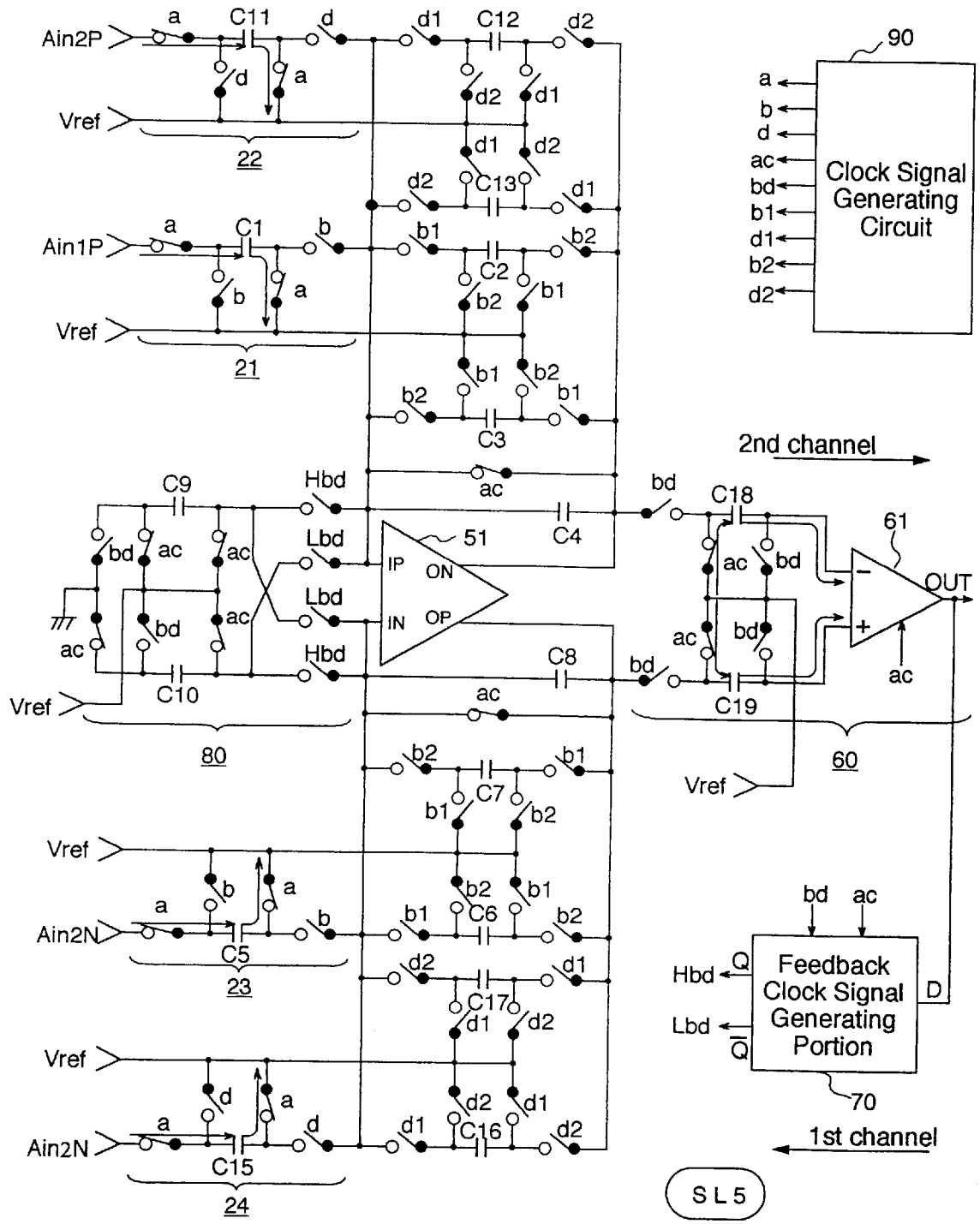
FIG. 15 is a circuit diagram illustrating an operational condition of the A/D converter shown in FIG. 9.

During the time slot SL5 of the sampling period $TS_{i+1}$, the clock signals a and ac are high, but the other signals are not, as for the time slot SL1. Therefore, the condition of the analog switches becomes as shown in FIG. 15 and the following operation is conducted in the A/D converter.

a. In the input switched capacitor portions 21 to 24, the samplings are conducted for the input analog signals Ain1P, Ain2P, Ain1N and Ain2N again, so that the electric charges according to the signal levels of the analog signals are held in the capacitors C1, C11, C5 and C15, respectively.

b. In the integrating portion 50, both terminals of each of the capacitors C4 and C8 are short-circuited by the initializing analog switches, respectively, so that the integral calculus of the integral calculating portion 50 becomes zero.

c. In the one bit ADC portion 60, the voltage held in the capacitors C18 and C19 are inputted into the non-inverting input terminal and the inverting input terminal of the comparator 61, respectively, under the condition that the polarities thereof are inverted. The voltage held in each capacitor has been obtained from the integrating portion 50 during the time slot SL4 of the sampling period $TS_i$, which corresponds to the integral calculus for the second channel. When the clock signal ac is outputted, the digital signal OUT for the second channel representing the comparison result is outputted from the comparator 61.

d. Before the digital signal for the second channel is outputted, a digital signal for the first channel has been outputted from the comparator 61; the signal is taken into the feedback clock signal generating portion 70 according to the clock signal ac.

e. In the one bit DAC converting portion 80, the voltage of "OV" is kept in the capacitor C9, while the voltage of Vref is kept in the capacitor C10.

(6) Time Slot SL6

Figure 16:
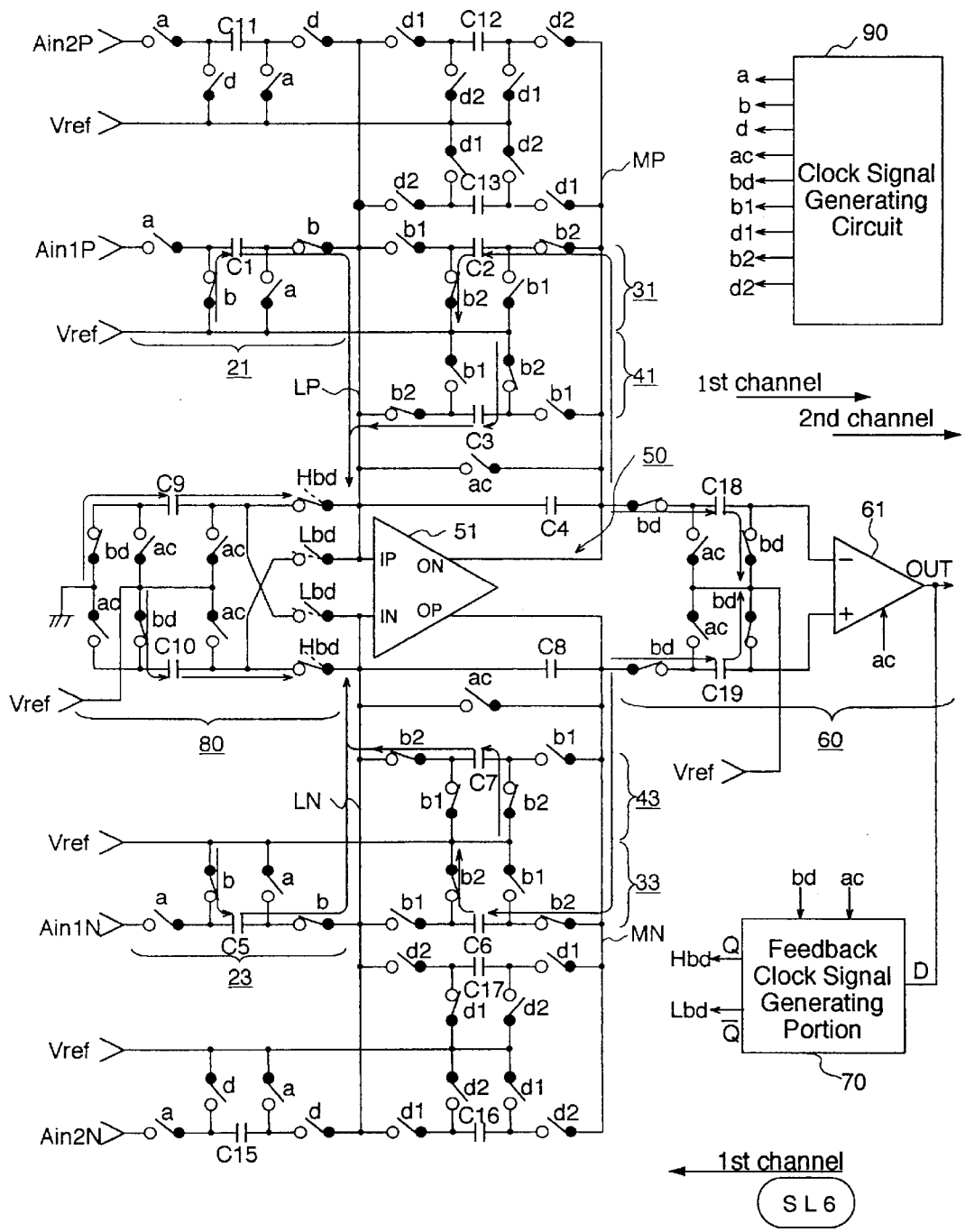
FIG. 16 is a circuit diagram representing an operational condition of the A/D converter shown in FIG. 9.

During the time slot SL6, the clock signals b, bd and b2 are high, but the other clock signals are not. According to the outputting of the clock signals, the condition of the analog switches becomes as shown in FIG. 16; the following operation is conducted in the A/D converter.

a. In the input switched capacitor portions 21 and 23, which are corresponding to the first channel, the electric charges held in the capacitors C1 and C5 are supplied into the positive phase input line LP and the negative phase input line LN, respectively, under the condition that the polarities thereof are inverted.

b. In the feedback clock signal generating portion 70, either one of the clock signal Hbd or Lbd is outputted at the simultaneous timing of the clock signal bd. Which clock signal is outputted from the portion 70 is determined by the value of the digital signal "OUT" corresponding to the first channel which has been taken into the feedback clock signal generating portion 70 during the time slot SL5. That is to say, in case the signal "OUT" is "1", the clock signal Lbd is outputted, while, in case the signal OUT is "1" the clock signal Lbd is outputted.

c. In the one bit DAC portion 80, a feedback analog signal corresponding to the digital signal for the first channel of the sampling period $TS_i$ is generated according to the clock signal Hbd or Lbd, and then the signal is given to the positive phase input line LP and the negative phase input line LN, respectively.

d. In the second integral calculus memory portions 41 and 43, the electric charges held in the capacitors C3 and C7 are supplied into the positive phase input line LP and the negative phase input line NP, respectively, under the condition that the polarities thereof are inverted. The electric charges held in these capacitors have been given from the integrating portion 50 during the sampling period $TS_i$; the charges correspond to the integral calculus for the first channel during the sampling period $TS_i$.

e. In the integral calculating portion 50, since the initializing analog switches S501 and S502 are opened, the above mentioned signals, which are supplied from the positive phase input line LP and the negative phase input line LN, are integrated. As a result, the integral calculus for the first channel of the sampling period $TS_i$ is added to the input analog signal for the first channel, which is taken into the portion during the time slot SL5; a signal obtained by subtracting the feedback analog signal from the added result is obtained as an integral calculus for the first channel of the relevant sampling period $TS_{i+1}$; the voltage corresponding to the thus obtained integral calculus is outputted to the positive phase output line MN and the negative phase output line MN, respectively, from the differential amplifier 51.

f. In the first integral calculus memory portions 31 and 33, the electric charges corresponding to the integral calculus for the first channel are kept.

g. In the one bit ADC portion 60, the voltage corresponding to the positive phase component of the integral calculus for the first channel, which is obtained in the integrating portion 50, is held in the capacitor C18 and the negative phase component thereof is held in the capacitor C19.

As stated above, the process in the time slot SL6 is substantially the same as that in the time slot SL2 of the sampling period $TS_i$, but the allotment of the first integral calculus memory portions 31 and 33 are replaced by those of the second integral calculus memories 41 and 43.

(7) Time Slot SL7

Figure 17:
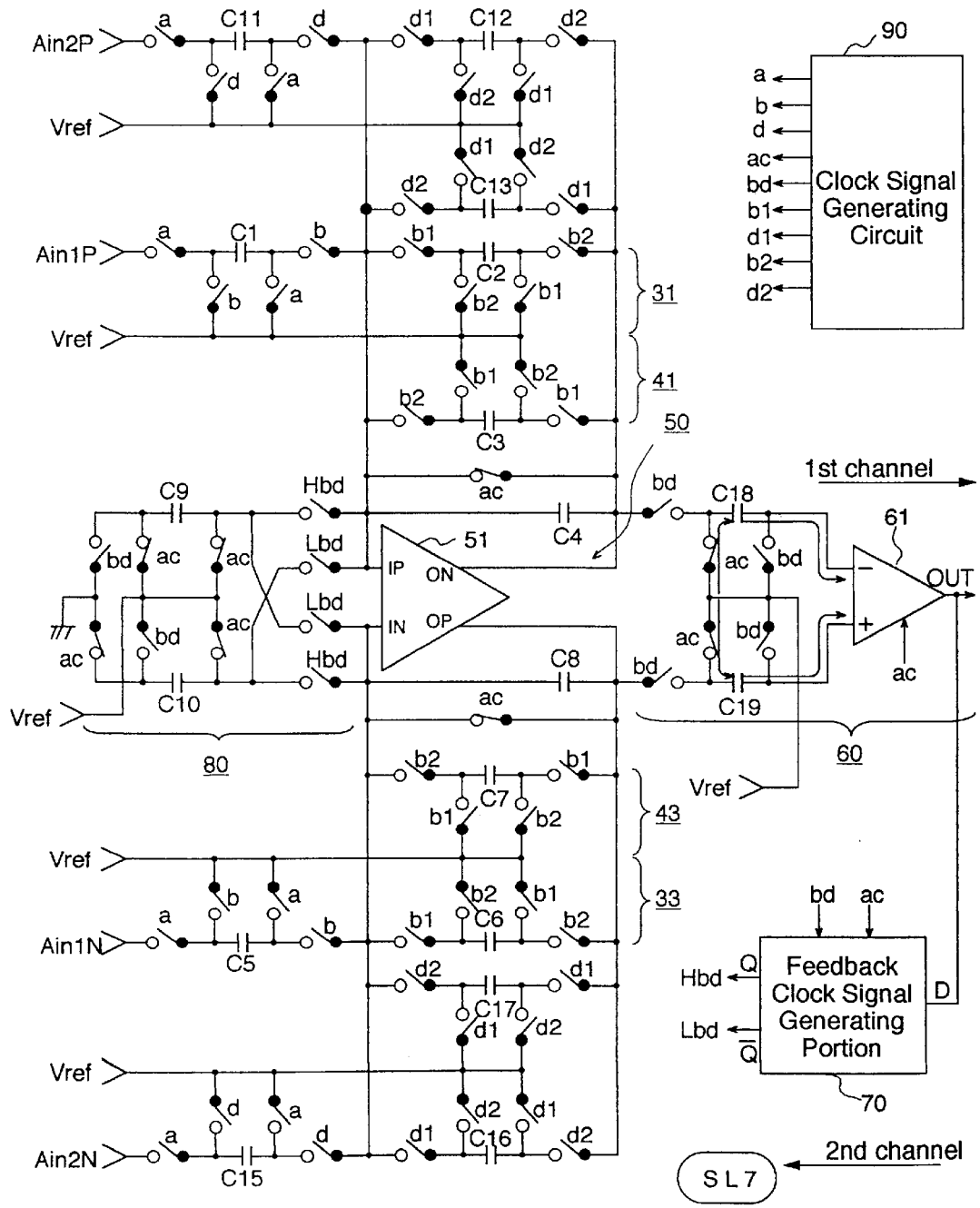
FIG. 17 is a circuit diagram illustrating an operational condition of the A/D converter shown in FIG. 9.

During the time slot SL7, only the clock signal ac is high and the other clock signals are not, as for the time slot SL3. According to the clock signal ac, the condition of the analog switches becomes as shown in FIG. 17, and the following operation is conducted in the A/D converter.

a. In the one bit ADC portion 60, the voltages kept in the capacitors C18 and C19 are applied to the inverting input terminal and non-inverting input terminal of the comparator 61 to be compared to each other. The input voltage held in each capacitor has been given from the integrating portion 50 during the time slot SL6; the voltage corresponds to the integral calculus for the first channel. The digital signal for the first channel representing the above comparison result is outputted from the ADC portion 60 in accordance with the clock signal ac.

b. The digital signal for the second channel, which has been outputted from the one bit ADC portion 60 before the digital signal for the first digital signal is outputted, is taken into the feedback clock signal generating portion 70 according to the clock signal ac.

c. In the integral calculating portion 50, the initializing analog switches S501 and S502 electrically conduct, so that the integrated calculus thereof becomes zero.

d. In the one bit DAC portion 80, the voltage applied between both terminals of the capacitor C9 becomes "zero" while the voltage applied between both terminals of the capacitor C10 is set at "Vref".

e. In the first integral calculus memory portions 31 and 33, all of the analog switches are opened. Therefore, the electric charges in the capacitors C2 and C6, which have been given during the time slot SL6, are kept as they are.

(8) Time Slot SL8

Figure 18:
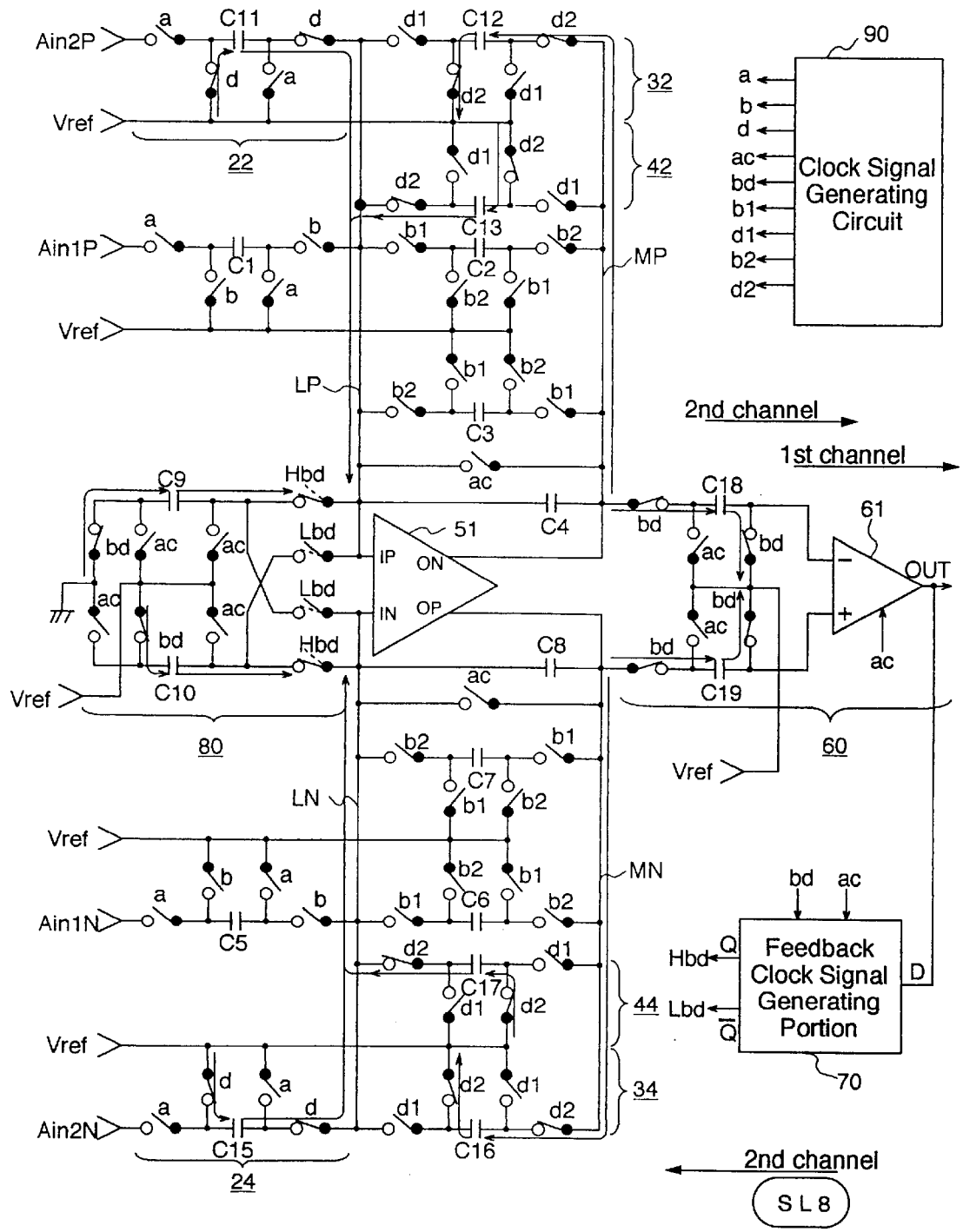
FIG. 18 is a circuit diagram representing an operational condition of the A/D converter shown in FIG. 9.

During the time slot SL8, the clock signals d, bd and d2 are high, but the other signals are not. Therefore, according to the outputs of the clock signals d, bd and d2, the condition of the analog switches becomes as shown in FIG. 18 and the following operation is conducted in the A/D converter.

a. In the switched capacitor portion 22 and 24 for the second channel, the electric charges held in the capacitors C11 and C15 are supplied to the positive phase input line LP and the negative phase input line LN, respectively, under the condition that the polarities thereof are inverted.

b. From the feedback clock signal generating portion 70, either one of the clock signal Hbd or Lbd is outputted at a simultaneous timing with the clock signal bd. That is to say, when the digital signal for the second channel, which has been taken in the feedback clock signal generating portion 70 during the prior time slot SL3. is "0", the clock signal Hbd is outputted, while the digital signal is "1" the clock signal Lbd is outputted.

c. In the one bit DAC portion 80, a feedback analog signal corresponding to the digital signal for the second channel is generated and the thus generated signal is given to the positive phase input line LP and the negative phase input line LN, respectively.

d. In the second integral calculus memory portions 42 and 44, the electric charges held in the capacitors C13 and C17 are supplied to the positive phase input line LP and the negative phase input line LN, respectively, under the condition that the polarities thereof are inverted. The electric charge held in these capacitors correspond to the integral calculus for the second channel, which is obtained during the sampling period $TS_i$.

e. In the integrating portion 50, since the initializing analog switches S501 and S502 are opened, for the signals supplied from the positive input line LP and the negative input line LN are integrated. As a result, the integral calculus responding to the second channel, which has been obtained during the sampling period $TS_i$, is added to the input analog signal for the second channel, which has been taken during the time slot SL5, and a value which is obtained by subtracting the feedback analog signal from the adding result is obtained as an integral calculus for the second channel of the sampling period $TS_{i+1}$, so that the voltage corresponding to the thus obtained integrated calculus is outputted from the differential amplifier 51 to the positive phase output line MP and the negative phase output line MN, respectively.

f. In the second integral calculus memory portions 32 and 34, the electric charges corresponding to the thus obtained integral calculus for the second channel are held in the capacitors C12 and C16.

g. The voltages corresponding to the positive phase component for the second channel and the negative phase component of the integral calculus for the second channel are supplied from the integrating portion 50 to the one bit ADC portion 60. These voltages are kept in the capacitors C18 and C19 of the one bit ADC portion 60. When the sampling period is switched to the next time slot SL1 of the next sampling period, the voltages held in the capacitors are given to the comparator 61 to output the digital signals for the second channel.

In this manner, the process conducted during the time slot SL8 is substantially the same as that in the time slot SL4. However, the allotments of the first integral calculus memory portions 32 and 34 are replaced for those of the second integral calculus memory portions 42 and 44.

Thereafter, the processes of the time slots SL1 to SL8 are repeatedly conducted in the above explained order so that A/D signal converting of input analog signals of the first and second channels is proceeded.

Construction of the Second Embodiment

Figure 19:
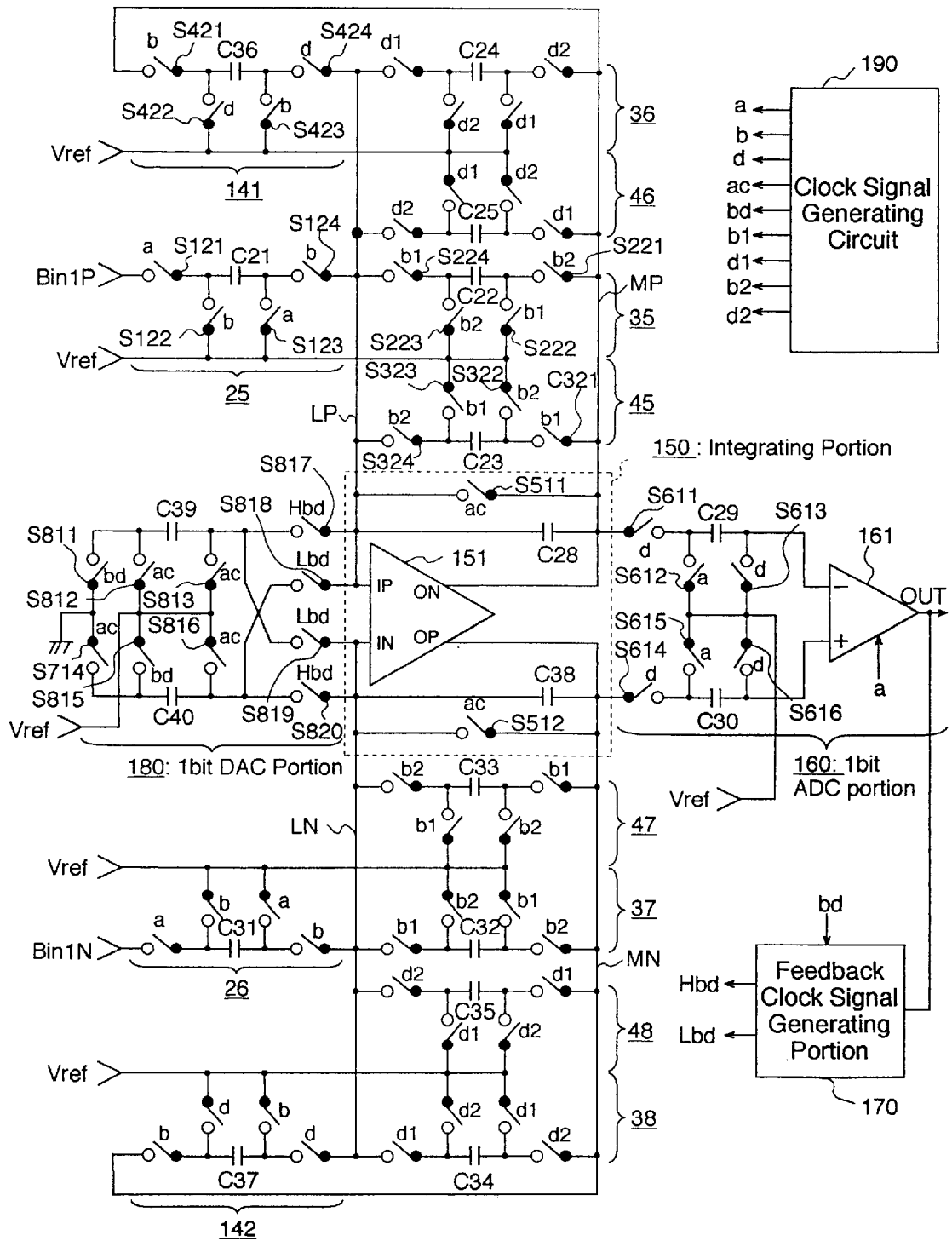
FIG. 19 is a circuit diagram showing a construction of the A/D converter according to the second embodiment of the present invention.

FIG. 19 is a block diagram showing a construction of the delta sigma type A/D converter according to the second embodiment of the present invention. In the A/D converter, a balanced type input analog signal Bin composed of a positive phase signal BinP and a negative phase signal BinN is converted to digital signals, so that the A/D converter has a symmetrical circuit construction where a part for processing the positive phase signal and a part for processing the negative phase signal are arranged in a symmetrical manner.

Figure 20:
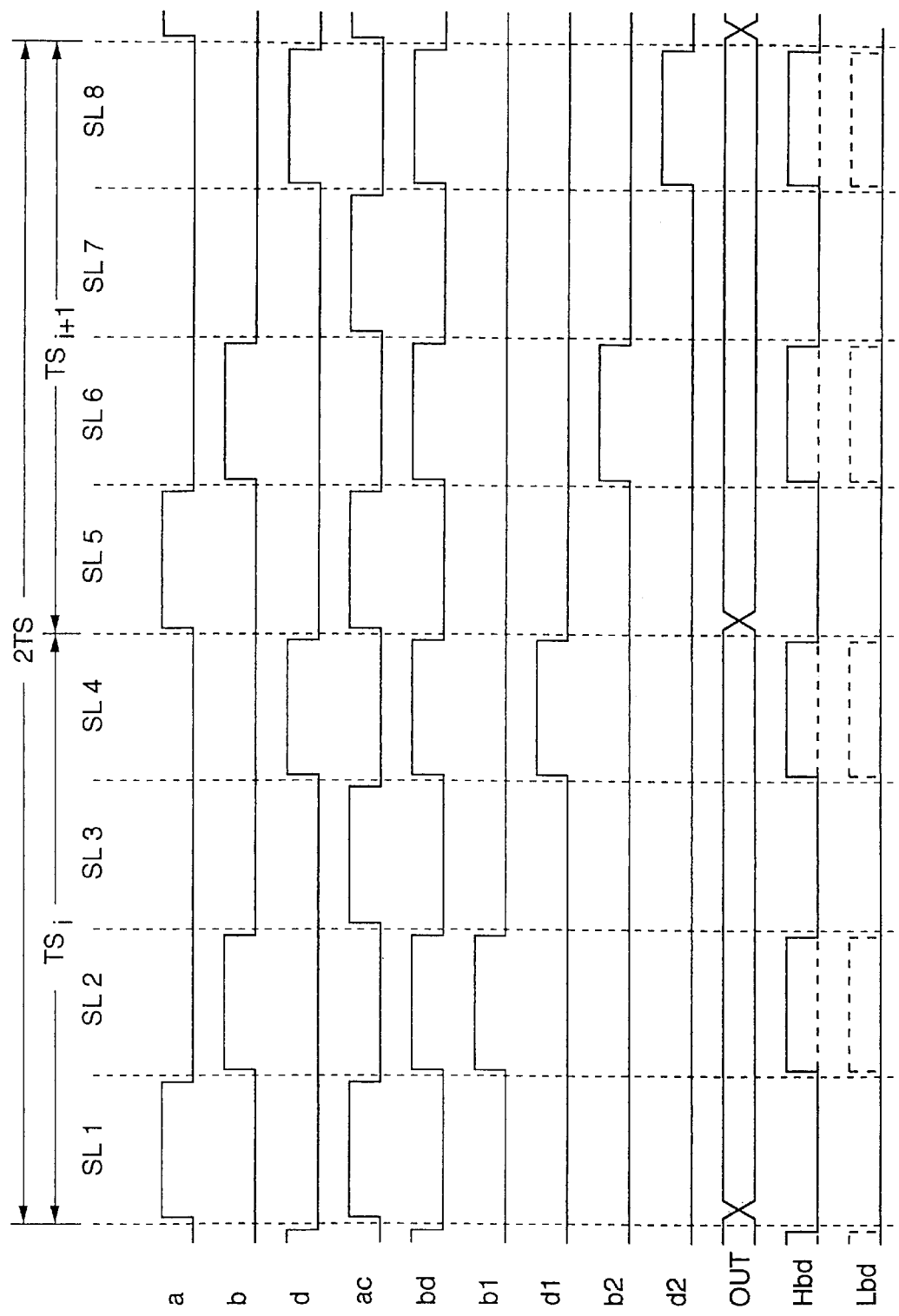
FIG. 20 is a timing chart depicting an operational condition of the A/D converter shown in FIG. 19.

A clock circuit 190 is provided for controlling operation timings of each portion of the A/D converter. From the clock circuit 190, are outputted clock signals a, b, d, ac, bd, b1, d1, b2 and d2 which are necessary to control the operational timing of the A/D converter. FIG. 20 is a timing chart depicting wave shapes of these clock signals.

Input switched capacitor portions 25 and 26 are provided for outputting electric currents corresponding to the signal levels of said input analog signals, respectively. Out of the above-mentioned input analog signals, the positive phase signal BinP is supplied into the input switched capacitor portion 25, and the negative phase signal BinN is to the switched capacitor portion 26, respectively. The electric current outputted from the input switched capacitor portions 25 is supplied to a signal line LP (hereinafter, called as "positive phase input line LP"), while, the electric current outputted from the input switched capacitor portion 26 is supplied to a signal line LN (hereinafter, called as "negative phase input line LN").

The construction of each of the switched capacitor portions will be explained. The input switched capacitor portion 25 comprises one capacitor C21 and four analog switches S121 to S124.

The analog switches S121 and S123 electrically conduct in response to the clock signal a. When the switches S121 and S123 conduct, a signal path of "analog switch S121→ capacitor C21→ analog switch S123→ reference supply Vref" is formed, so that an electric charge corresponding to the signal level of the signal Bin1P is held in the capacitor C21 via the signal path.

The analog switches S122 and S124 electrically conduct by the clock signal b. When the switches S122 and S124 conducted, a signal path of reference supply Vref→ analog switch S122→ capacitor C21→ analog switch S124→ positive phase input line LP" is formed, so that the electric charge kept in the capacitor C21 is supplied to the positive input line LP.

As shown in FIG. 20, the clock signals a and b are alternatively outputted with a predetermined time period. Therefore, the operation that the electric charge corresponding to the signal level of the analog signal BinP is held in the capacitor 21 and the operation that the thus held electric charge is supplied to the positive input line LP are repeated with the predetermined time period, so that the electric current corresponding to the signal level of the analog signal BinP is outputted to the positive phase input line LP.

The other input switched capacitor portion 26 has the same construction as that of the input switched capacitor portion 25. That is to say, the portion 26 also comprises the capacitor C31, in which an electric charge corresponding to the level of input analog signal BinN is held, and four analog switches, by which signal path is formed for supplying the inputted analog signal to the capacitor and for outputting the electric charge held in the capacitor to the negative input line LN.

An integral calculating portion 150 comprises a differential amplifier 151, integrating capacitors C283 and C38, analog switches S511 and S512. The switches are provided for the purpose of initialization. A non-inverting input terminal IP of the differential amplifier 151 is connected to the positive input line LP, and an inverting input terminal IN thereof to the negative input line LN. The integration capacitor C28 are inserted between the non-inverting input terminal IP and an inverting output terminal ON of the differential amplifier 151 and the integral capacitor C38 is inserted between the inverting output terminal IN and non-inverting output terminal OP thereof, respectively. Inverting output terminal ON and the non-inverting output terminal OP of the differential amplifier 151 are connected to a signal line MP (hereinafter called as "positive phase output line MP") and a signal line MN (hereinafter called as "negative phase output line MN"), respectively.

According to the above-mentioned construction, signals inputted from the non-inverting input terminal IP and the inverting input terminal IN of the differential amplifier 151 are integrated while maintaining the potential on these terminals IP and IN at the level of the reference supply Vref; all of the electric charges supplied from the positive phase input line LP are stored in the integral capacitor C28 and all of the electric charge supplied from the negative phase input line LN is stored in the integral capacitor C38. As a result, a voltage corresponding to the integrated calculus is outputted between the inverting output terminal ON and the non-inverting output terminal OP of the differential amplifier 151. The output voltage, which corresponds to the integrated calculus, is separated into a positive component and a negative component to be supplied into the positive output line MP and the negative output line MN, respectively.

Further, the initializing analog switches S511 and S512 are connected to the integral capacitors C28 and C38 in a parallel manner, respectively. These initializing analog switches S511 and S512 electrically conduct responding to the clock signal ac so that both terminals of the integral capacitors C28 and C38 are short-circuited to make the integral calculus zero.

In the integral calculation portion 150, a plurality of the integrating process are successively repeated under a time sharing control. In order to make possible to carry out such a time sharing control for the integrating processes, the following means are provided in the present embodiment.

Means A: In order to interrupt the running integrating process, the integral calculus is initialized to zero in the integrating portion 150 to use the integrating portion 150 for the next integrating process. The above-explained initializing analog switches S511 and S512 are provided for this purpose.

Means B: When the running integrating process is interrupted, the integral calculus which is obtained at the timing of the interruption is stored, and when the integrating process is restarted, the stored integral calculus is given to the integrating portion 150 so that the interrupted integrating process is restarted from the interrupted condition. This operation is carried out by first integral calculus memory portions 35 to 38 and second integral calculus memory portions 45 to 48, which are shown in FIG. 19.

These memory portions are provided for storing signals representing the integral calculus, which are obtained at every integrating process conducted in the integrating portion 150. In the second embodiment, the analog signal is converted into the digital signal by conducting two different types of integrating processes: the positive phase signal representing the integral calculus of the first integrating process is stored in the first integral calculus memory portion 35 and the second integral calculus memory portion 45; the negative phase signal representing the integral calculus of the first integral process is memorized in the first and second integral calculus memory portions 37 and 47; the positive phase signal representing the integral calculus of the second integrating process is stored in the first integral calculus memory portion 36 and the second integral calculus memory portion 46; the negative phase signal representing the integral calculus of the second integrating process is in the first integral calculus memory portion 38 and the second integral calculus memory portion 48, respectively.

The construction of each integral calculus memory portion will be explained below. The first integral calculus memory portion 35 comprises one capacitor C22 and four analog switches S221 to S224, as the same as that of the above-explained input switched capacitor portion. The analog switch S221 and S223 electrically conduct by the clock signal b2. When the switches S221 and S223 conduct, a signal path of "positive output line MP→ analog switch S221→ capacitor C22→ analog switch S223→ reference supply Vref" is formed, so that an electric charge corresponding to a positive phase component of the signal representing the integral calculus is held in the capacitor C22. The analog switches S222 and S224 electrically conduct according to the clock signal b1. When the switches S222 and S224 conduct, a signal path of "reference supply Vref→ analog switch S222→ capacitor C22→ analog switch S224→ positive phase input line LP" is formed; through the signal path, the electric charge held in the capacitor C22 is supplied to the positive phase input line LP under the condition that the polarity thereof is inverted. In this manner, when the clock signal b2 is outputted, the sampling of the integrated calculus is conducted, and when the clock signal b1 is outputted, the electric charge, which is equivalent to the integrated calculus, is supplied to the positive phase input line LP under the condition that the polarity thereof is inverted.

The second integral calculus memory 45 has the same construction as that of the first integral calculus memory 35, which comprises one capacitor C23 and four analog switches S321 to S324. However, in the second integral calculus memory portion 45, the signal path for supplying the voltage corresponding to the positive phase component of the integral calculus to the capacitor C23 is formed by that the analog switches S321 and S323 electrically conduct in response to the clock signal b1. Further, the signal path for supplying the electric charge held in the capacitor C23 to the positive phase input line LP is formed by that the analog switches S322 and S324 electrically conduct in response to the clock signals b2.

As stated in the above, the clock signals b1 and b2 serve in an opposite manner in the first integral calculus memory 35 and the second integral calculus memory 45. Therefore, when the clock signal b2 is outputted, the voltage on the positive phase output line MP is applied to the capacitor C22 of the first integral calculus memory portion 35, and at the same time, the electric charge held in the capacitor C23 of the second integral calculus memory 45 is supplied to the positive phase input line LP. While, when the clock signal b1 is outputted, the voltage on the positive phase output line MP is applied to the capacitor C23 of the second integral calculus memory 45 portion ; at the same time, the electric charge held in the capacitor C22 of the first integral calculus memory portion 35 is supplied to the positive phase input line LP.

The other integral calculus memory portion have the same construction as the first integral calculus memory portion 35 and the second integral calculus memory portion 45, and work in the same manner. That is to say, the other memory portions also comprise one capacitor and four analog switches, respectively. The numerical references of each capacitor and the numerical references of the clock signals for controlling the continuity of the analog switches are as shown in FIG. 19.

The integral calculus transferring portions 141 and 142 for transferring integral calculuses between different type integrating processes are provided in order to store signals representing the integral calculus obtained from the integrating portion 150 as the same as the integral calculus memory portions 141 to 144; however, these memory portions 141 and 142 are used for a different purpose. That is to say, when highly-ordered integrating process is carried out, it becomes necessary to transfer the integral calculus of the current integrating process to the other integrating process; these memory portions 141 and 142 are provided for storing signals showing the integral calculus, which is to be transferred to the next integrating process.

The integral calculus transferring portions for transferring the calculus between the different type processes have the same construction as those of the input switched capacitor portion 25, etc. For instance, the transferring portion 141 comprises one capacitor C36 and four analog switches S411 to S414. The analog switches S411 and S413 electrically conduct by the clock signal b. When these analog switches conduct, a signal path of "positive signal output line MP→ analog switch S411 capacitor C36→ analog switch S413→ reference supply Vref" is formed. To the positive phase output line MP is supplied a positive phase signal representing the integral calculus from the integrating portion 150; this signal is supplied via the above mentioned signal path so that the electric charge corresponding to the level of the signal showing the integral calculus is held in the capacitor C36. Further, the analog switches S412 and S414 are made conduct by the clock signal d. When these analog switches electrically conduct, a signal path of "reference supply Vref→ analog switch S412→ capacitor C36→ analog switch S414→ positive signal output line LF" is formed. The electric charge held in the capacitor C36 is supplied to the positive phase input line LP via the signal path.

One bit ADC (analog/digital converting) portion 160 is provided for changing the integral calculus obtained in the integrating portion 150 into digital signals, which comprises two capacitors C29 and C30, six analog switches S611 to S616 and a comparator 161.

In the one bit ADC portion 160, the analog switches S611, S613, S614 and S616 electrically conduct in response to the clock signal d. When these analog switches conduct, signal paths of "positive phase output line MP→ analog switch S611→ capacitor C29→ analog switch S613→ reference supply Vref", and "negative phase output line MN→ analog switch S614→ capacitor C30→ analog switch S61→ reference supply Vref" are formed. By the former signal path, a voltage corresponding to the positive phase component of the integral calculus is applied on the capacitor C29 and by the later signal path a voltage corresponding to the negative phase component of the integral calculus is applied on the capacitor C30. When the clock signal d is low to open the analog switches S611, S613, S614 and S616, the voltages applied on the capacitors C29 and C30 at that time are kept as they are.

While, the analog switches S611 and S615 electrically conduct by the clock signal a. When the analog switches conduct, signal paths of "reference supply Vref→ analog switch S612→ capacitor C29→ inverting input terminal of the comparator 161", and "reference supply Vref→ analog switch S614→ capacitor C30→ non-inverting input terminal of the comparator 161" are formed. Through these signal paths, the polarities of the voltages held in the capacitor C29 and C30 are inverted and then supplied to the inverting input terminal and the non-inverting input terminal of the comparator 161, respectively.

The comparator 161 is constituted of a general comparator and a latch circuit; when the clock signal a is given thereto, the input voltages on the inverting input terminal and the non-inverting terminal at that timing are compared to each other, and the compared result is outputted thereof as a one bit digital signal "OUT". The digital signal "OUT" is supplied to a feedback clock signal generating portion 170 and other components, e.g., a digital filter, etc. (not shown), which are connected to the portion 170.

From the feedback clock signal generating portion 170, when the output digital signal of the comparator 161 is "0", a clock signal Hbd is outputted at the simultaneous timing of the clock signal bd, while the digital signal is "1", a clock signal Lbd is outputted at the simultaneous timing of the clock signal bd.

A one bit DAC (digital/analog converting) portion 180 is provided for generating a feedback analog signal corresponding to the digital signal "OUT". The DAC portion 180 comprises capacitors C39 and C40 and analog switches S811 to S820. The analog switches S812, S813, S814 and S816 electrically conduct by the clock signal ac. When these analog switches conduct, both terminals of the capacitor C39 are connected to reference supply Vref, and the capacitor C40 is connected between the reference supply Vref and a ground line. Therefore, every the clock signal ac is generated once, on the capacitor C39 is held the voltage of "0V", while on the capacitor C40 is held the voltage of "Vref", respectively. On the other hand, the analog switches S811 and S815 are closed by the clock signal bd. As a result, one of the terminal ends of the capacitor C39 is connected to ground, and then from the other one of the ends of the capacitor C39 is outputted "0V". Further, one of the terminals of the capacitor C40 is connected to the reference supply Vref, so that from the other terminal of the capacitor C40 is outputted a voltage of "2Vref".

The analog switches S817 to S820 are provided for supplying the thus outputted voltages of the capacitor C39 and C40 into the positive phase input line LP and the negative phase input line LN as analog feedbacks signals, respectively. These switches electrically conduct by the clock signal Hbd or Lbd, which are generated in the feedback clock signal generating portion 170. First, the analog switches S817 and S820 electrically conduct by the clock signal Hbd. When these switches conducted, the output voltage of the capacitor C39 (=0V) is supplied to the positive phase input line LP and the output voltage of the capacitor C40 (=2Vref) is supplied to the negative phase input line LN, respectively. Further, the analog switches S818 and S819 conduct by the clock signal Lbd. When the switches conduct, the output voltage of the capacitor C39 (=0V) is supplied into the negative phase input line LN and the output voltage of the capacitor C40 (=2Vref) is into the positive phase input line LP, respectively.

Operation of the Second Embodiment

The operation of the second embodiment will be explained below in accordance with the timing chart depicted in FIG. 20. In the second embodiment, the input analog signal is sampled at a predetermined sampling period TS to convert analog signals into digital signals. The successive processes for the A/D conversion, are proceeded by a unit of time slot, which is determined by dividing the sampling period into four parts. The processes executed in the successive eight (8) time slots, i.e. the time period 2 TS for two sampling periods are repeated. Therefore, the two subsequent sampling periods $TS_i$ and $TS_{i+1}$ are considered, and the operation of the second embodiment during the time slots SL1 to SL8, which are determined by dividing the sampling periods $TS_i$ and $TS_{i+1}$ into eight parts, will be explained below.

Figure 21:
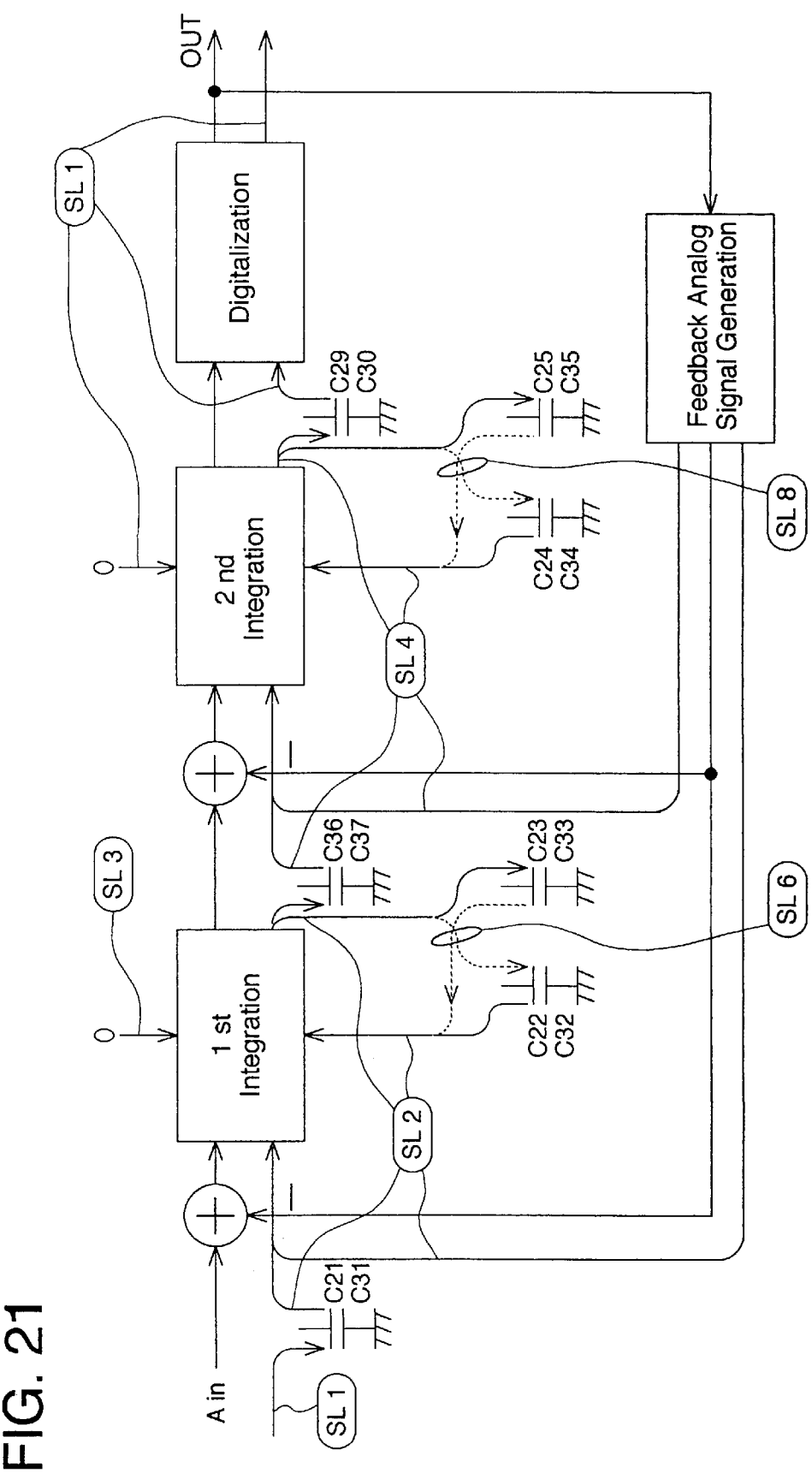
FIG. 21 is a block diagram illustrating a flow of the delta-sigma modulating process executed in the second embodiment.

In the A/D converter of the second embodiment, the second order delta sigma modulation is carried out; the process of the second order delta-sigma modulation is shown in FIG. 21 in a schematic manner. As shown in FIG. 21, the first integral calculating process and the second integrating process are carried out, and the result of the first integrating process is included in the object to be processed in the second integrating process. However, in the second embodiment, is provided only one integrating portion 150; therefore, each integrating process should be alternatively conducted under the time sharing control. In FIG. 21, not only the processes composing of the delta-sigma modulation is illustrated but also the condition of giving and receiving the signals when the processes are conduced shown by arrows. Furthermore, the time slots, during which the processes and actions of giving and receiving the signals are executed, are also depicted in FIG. 21. The operations of the A/D converter according to the second embodiment in the time slots will be explained along with the timing chart illustrated in FIG. 20.

(1) Time Slot SL1

Figure 22:
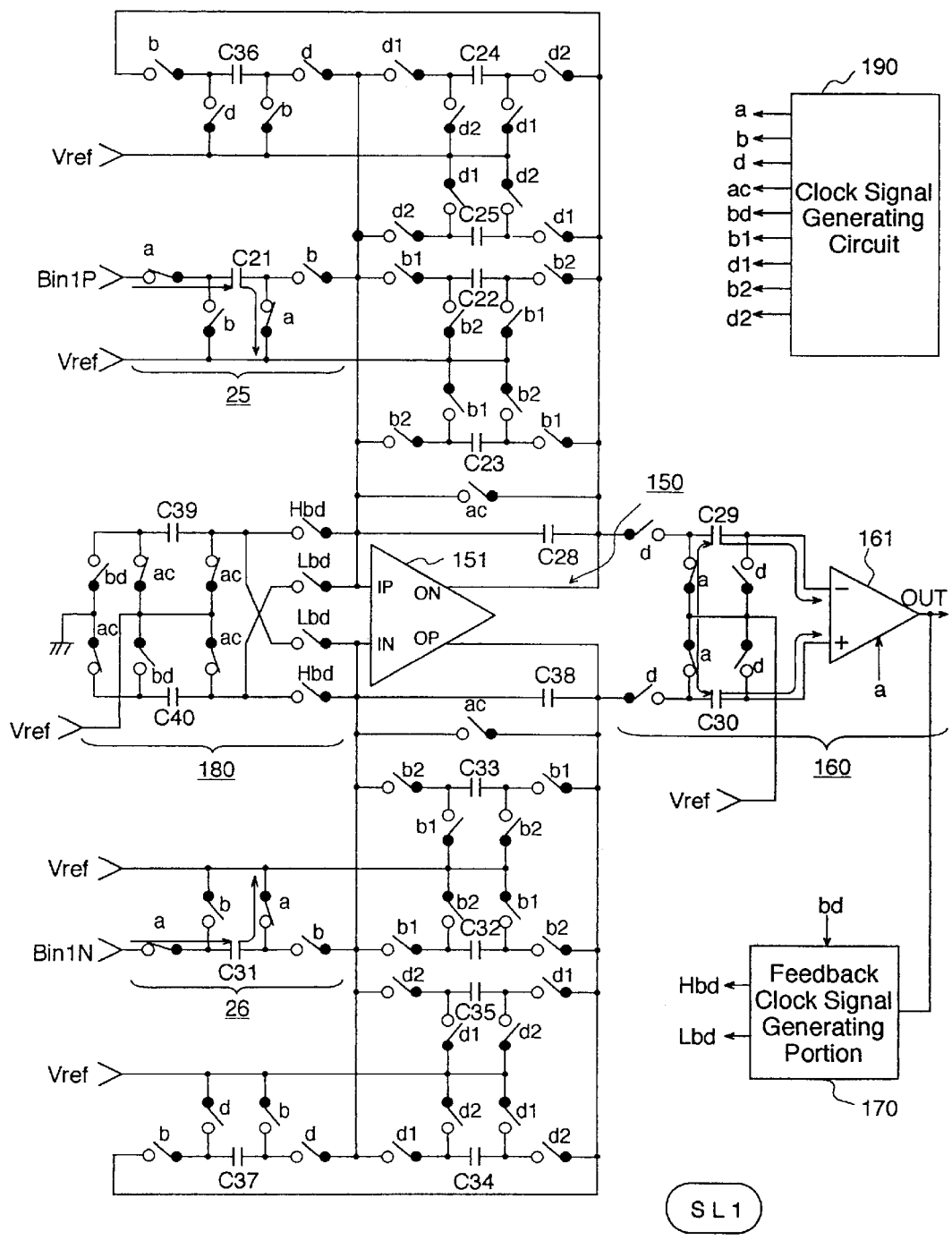
FIG. 22 is a circuit diagram representing an operational condition of the A/D converter shown in FIG. 19.

During the time slot SL1 of the sampling period $TS_i$, only the clock signals a and ac are high, but the others are not. According to the output of the clock signals a and ac, the condition of the analog switches becomes as shown in FIG. 22, and the following operations are conducted in the A/D converter.

a. In the input switched capacitor portions 25 and 26, the samplings of the input analog signal BinP and BinN are conducted, so that the electric charges corresponding to the level of the respective analog signals are held in the capacitor C21 and C31, respectively.

b. In the integral calculating portion 150, both terminals of each of the capacitors C28 and C38 are short-circuited by that the initializing analog switches are closed, so that the integral calculus in the integrating portion 150 is initialized to become zero. (Initialization of the integral calculus in the second integrating process in FIG. 21.)

c. In the one bit ADC portion 160, the voltage held in the capacitor C29 and C30 are inputted into the non-inverting input terminal and the inverting input terminal of the comparator 161, respectively, to be compared to each other. The voltages held in these capacitors have been given from the integrating portion 150 during the previous sampling period $TS_{i-1}$, which correspond to the integral calculus in the second integrating process shown in FIG. 21. When the clock signal a is outputted, the digital signal "OUT" representing the comparison result is outputted from the ADC portion 160.

When the integral calculus obtained from the integral calculating portion 150 during the previous sampling period $TS_{i-1}$ is positive, and the positive voltage is held in the capacitor C29 and the negative voltage is held in the capacitor C30, the input voltage applied to the inverting terminal of the comparator 161 becomes lower than the input voltage applied to the noninverting terminal of the comparator 161. As a result, a digital signal "OUT" of "1" (high level) is outputted from the comparator 161. On the other hand, when the integral calculus obtained from the integral calculating portion 150 during the previous sampling period $TS_{i-1}$ is negative, the input voltage applied to the inverting terminal of the comparator 161 becomes higher than the input voltage applied to the non-inverting terminal of the comparator 161, so that a digital signal OUT of "0" (low level) is outputted from the ADC portion 160.

d. In the one bit DAC converting portion 180, the voltage "OV" is kept in the capacitor C39, while the voltage "Vref" is kept in the capacitor C40.

(2) Time Slot SL2

Figure 23:
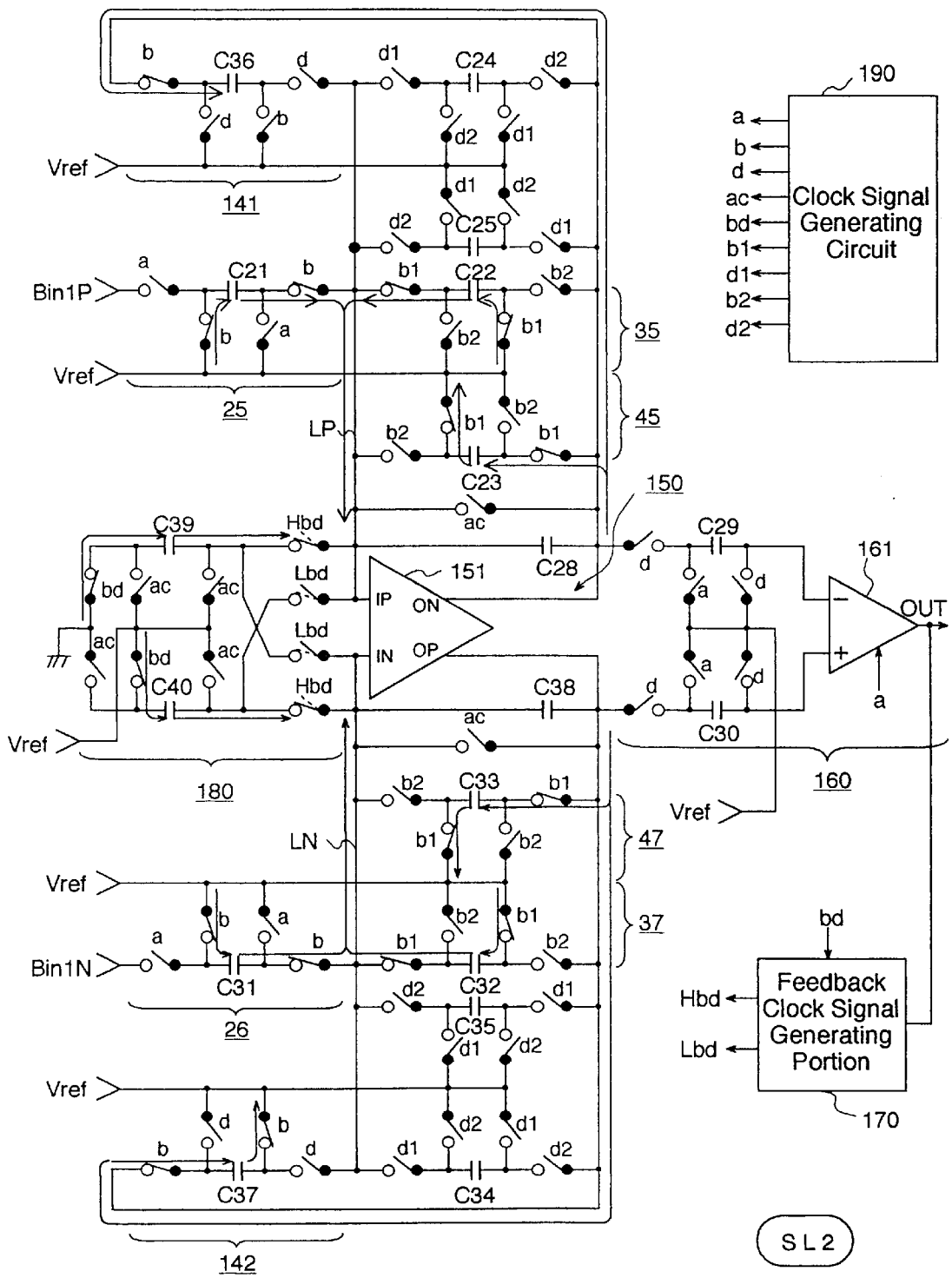
FIG. 23 is a circuit diagram illustrating an operational condition of the A/D converter shown in FIG. 19.

During the time slot SL2, the clock signals b, bd and b1 are high, but the other clock signals are not. According to the output of these clock signals, the condition of the analog switches becomes as shown in FIG. 23; the following operation is conducted in the A/D converter.

a. In the input switched capacitor portions 25 and 26, the electric charge held in the capacitors C21 and C31 are supplied into the positive phase input line LP and the negative phase input line LN, respectively, under the condition that the polarities of the electric charges are inverted.

b. In the feedback clock signal generating portion 170, either one of the clock signals Hbd or Lbd is outputted at the simultaneous timing with the clock signal bd. Which clock signal is outputted from the portion 170 is determined by the value of the digital signal "OUT". That is to say, in case the signal "OUT" is "0", the clock signal Hbd is outputted, while in case the signal "OUT" is "1" the clock signal Lbd is outputted.

c. In the one bit DAC portion 180, a voltage "OV" is applied to the analog switches S817 and S819 from the capacitor 39, and the voltage "2Vref" is applied to the analog switches S818 and S820 from the capacitor 40. When the digital signal "OUT" of "OV" and the clock signal Hbd are outputted, the voltage "OV" is given to the positive phase input line LP via the analog switch S817, and the voltage "2Vref" is given to the negative phase input line LN via the analog switch S820. On the other hand, when the digital signal of "1" and the clock signal Lbd are outputted, the analog switch S818 and S819 are closed, so that the voltage of "2Vref" is applied to the positive phase input line LP and the voltage of "OV" is to the negative phase input line LN.

d. In the first integral calculus memory portions 35 and 37, the electric charges held in the capacitors C22 and C32 are supplied into the positive phase input line LP and the negative phase input line LN, respectively. The electric charges held in these capacitors have been given from the integrating portion 150 during the previous sampling period $TS_{i-1}$, which are corresponding to the integral calculus of the first integrating process.

e. In the integral calculating portion 150, the initializing analog switches S511 and S512 are opened, so that the signals explained in the above items (a), (c) and (d), which are supplied from the positive phase input line LP and the negative phase input line LN, are integrated. As a result, the integrated calculus corresponding to the first integral calculating process during the previous sampling period $TS_{i-1}$ is added to the input analog signal obtained in the time slot SL1. A value obtained by subtracting the feedback analog signal from the adding result is obtained as an integral calculus of the first integral calculating process during the current sampling period $TS_i$; the voltage corresponding to the integrating value is outputted from the differential amplifier 151 to the positive phase signal output line MP and the negative phase signal output line MN, respectively.

f. In the second integral calculus memories 45 and 47, the operation for holding the thus obtained voltages corresponding to the integral calculus of the first integral calculating process are held. That is to say, the signal path from the positive phase output line MP to the reference supply Vref via the capacitor C23 is formed, and the electric charge corresponding to the positive phase component of the integral calculus is held in the capacitor C23 via the signal path. While, the signal path from the negative phase output signal MN to the reference supply Vref via the capacitor C33 is formed, and the negative phase component of the integral calculus is kept in the capacitor C33 via the signal path.

g. As shown in FIG. 21, the result of the first integrating process is used in the second integral calculating process. Therefore, the signals corresponding to the integral calculus of the first integrating process are held in the integral calculus transferring portions 141 and 142, which are for transferring the integral calculus between the different type of processes, in order to use the signal in the second integrating process.

That is to say, according to the clock signal b, the path from the positive phase output line MP to the reference supply Vref via the capacitor C36 and the path from the negative phase output line MN to the reference supply Vref via the capacitor C37 are formed. Via the former path, the electric charge corresponding to the positive component of the integral calculus of the first integrating process is held in the capacitor C36 and via the later path, the electric charge corresponding to the negative component of the integral calculus of the first integrating process is held in the capacitor C36.

(3) Time Slot SL3

Figure 24:
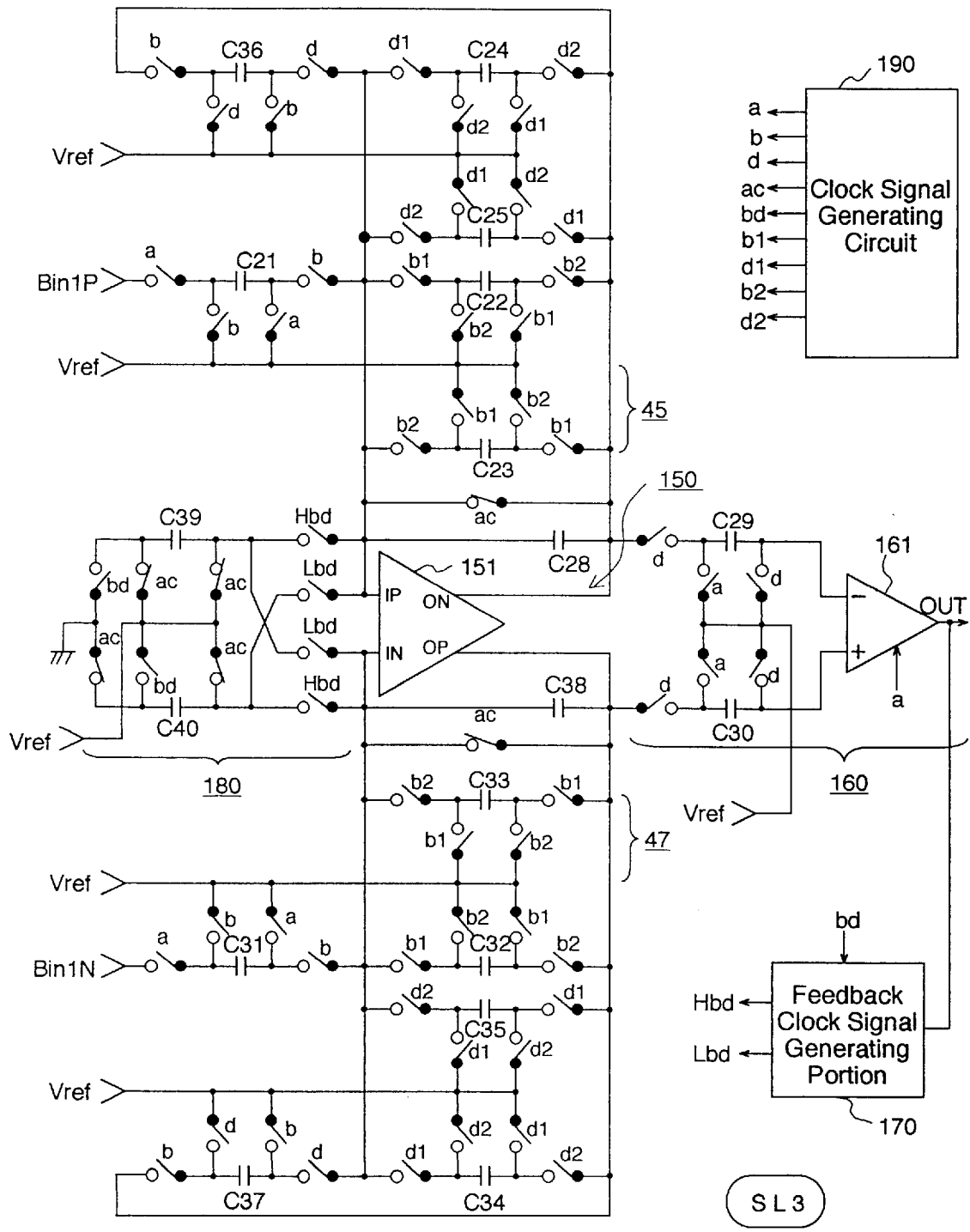
FIG. 24 is a circuit diagram representing an operational condition of the A/D converter shown in FIG. 19.

During the time slot SL3, the clock signal ac is high, but the other clock signals are not. According to the clock signal ac, the condition of the analog switches becomes as shown in FIG. 24, and the following operation is conducted in the A/D converter.

a. In the integrating portion 150, the initializing analog switches S511 and S512 electrically conduct so that the integral calculus becomes zero. Thereby, the integral calculus of the first integral calculating process shown in FIG. 21 becomes zero.

b. In the one bit DAC portion 180, the voltages applied on both terminals of the capacitors C39 becomes "0V" and the voltages on both the terminals of the capacitor C40 becomes "Vref".

c. In the second integral calculus memory portions 45 and 47 and in the integral calculus transferring portions 141 and 142, all of the analog switches are opened. Therefore, in the capacitors C23, C33, C36 and C37, the electric charges corresponding to the first integrating process, which have been given during the time slot SL2, are held as they are.

(4) Time Slot SL4

Figure 25:
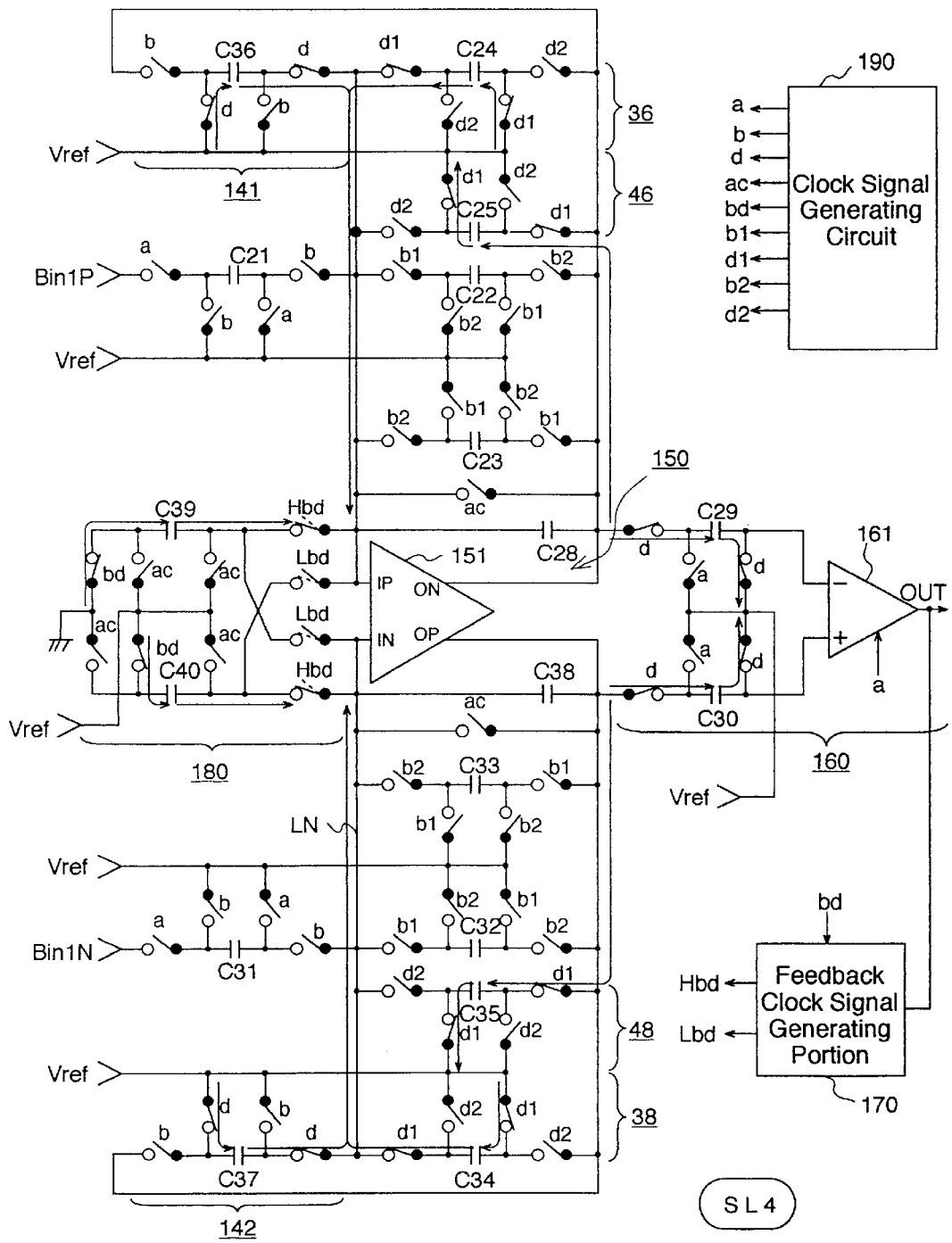
FIG. 25 is a circuit diagram illustrating an operational condition of the A/D converter shown in FIG. 19.

During the time slot SL4, the clock signals d, bd and d1 are high, but the other signals are not. According to the outputs of these clock signals, the condition of the analog switches becomes as shown in FIG. 25 and the following operation is conducted in the A/D converter.

a. In the integral calculus transferring portions 141 and 142, the electric charges held in the capacitors C36 and C37 are supplied to the positive phase input line LP and the negative phase input line LN, respectively, under the condition that the polarities thereof are inverted. These electric charges held in the capacitors have been given from the integrating portion 150 during the time slot SL2. The electric charges are corresponding to the integral calculus of the first integrating process.

b. In the feedback clock signal generating portion 170, when the output digital signal "OUT" is "0", the clock signal Hbd is outputted and when the signal "OUR" is "1" the clock signal Lbd is outputted.

c. In the one bit DAC portion 180, according to the clock signal Hbd or Lbd, a feedback analog signal corresponding to the outputted digital signal "OUT" is generated and the signal "OUT" is given to the positive phase input line LP and the negative phase input line LN, respectively. Since the detail of the operation in the time slot SL4 is the same as that in the explanation for the time slot SL2, the explanation is omitted here.

d. In the first integral calculus memory portions 36 and 38, the electric charges held in the capacitors C24 and C34 are supplied to the positive phase input line LP and the negative phase input line LN, respectively, under the condition that the polarities thereof are inverted. The electric charges held in the capacitors C24 and C34 have been given from the integrating portion 150 during the previous sampling period $TS_{i-1}$; the charges correspond to the integral calculus of the second integrating process shown in FIG. 21.

e. In the integrating portion 150, integrations for the signals explained in the above items (a), (c), and (d), which are supplied via the positive input line LP and the negative input line LN, are conducted. As a result, the integral calculus of the second integrating process during the previous sampling period $TS_{i-1}$ and the integral calculus of the first integrating process during the current sampling period $TS_i$ are added to each other; a value, which is obtained by subtracting the feedback analog signal from the adding result, is obtained as an integral calculus of the second integrating process of the sampling period $TS_i$; then a voltage corresponding to the thus obtained integrated calculus is outputted from the differential amplifier 151 to the positive phase output line MP and the negative phase output line MN, respectively.

f. In the second integral calculus memory portions 46 and 48, electric charges corresponding to the thus obtained integral calculus of the second integrating process are held in the capacitors C25 and C35.

g. The voltages corresponding to the positive phase component and negative phase component of the integral calculus of the second integrating process are supplied to the one bit ADC portion 160 from the integrating portion 150. These voltages are held in the capacitors C29 and C30 in the one bit ADC portion 160.

(5) Time Slot SL5

Figure 26:
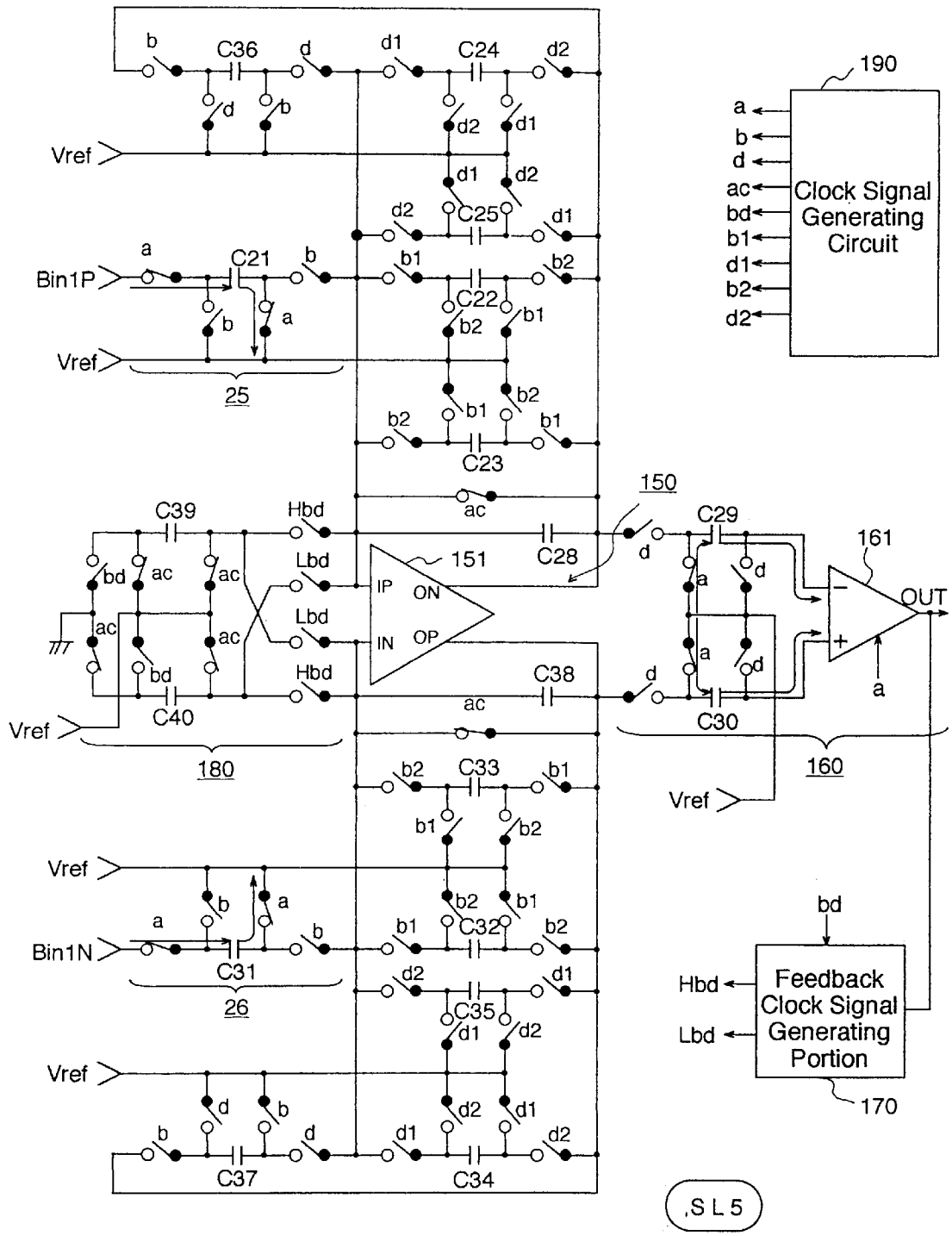
FIG. 26 is a circuit diagram representing an operational condition of the A/D converter shown in FIG. 19.

During the time slot SL5 of the sampling period $TS_{i+1}$, the clock signals a and ac are high, but the other signals are not, the same as in time slot SL1. Therefore, the condition of the analog switches becomes as shown in FIG. 26 and the following operations are conducted in the A/D converter.

a. In the input switched capacitor portions 25 and 26, the samplings for the input analog signals BinP and BinN are conducted again, so that the electric charges according to the signal levels of the analog signals are held in the capacitors C21 and C31, respectively.

b. In the integrating portion 150, both terminals of each of the capacitors C28 and C38 are short-circuited by the initializing analog switches, respectively, so that the integral calculus in the integrating portion 150 becomes zero.

c. In the one bit ADC portion 160, the voltage held in the capacitor C29 and C30 are inputted into the non-inverting input terminal and the inverting input terminal of the comparator 161, respectively, to be compared to each other under the condition that the polarities thereof are inverted. The voltages held in these capacitors C29 and C30 have been obtained from the integrating portion 150 during the previous time slot SL4 in the previous sampling period $TS_i$; the voltages correspond to the integral calculus of the second integrating process shown in FIG. 21. When the clock signal a is outputted, the digital signal "OUT" representing the comparison result is outputted from the comparator 161.

d. In the one bit DAC converting portion 180, the voltage "0V" is kept by the capacitor C39, while the voltage "Vref" is kept by the capacitor C40.

(6) Time Slot SL6

Figure 27:
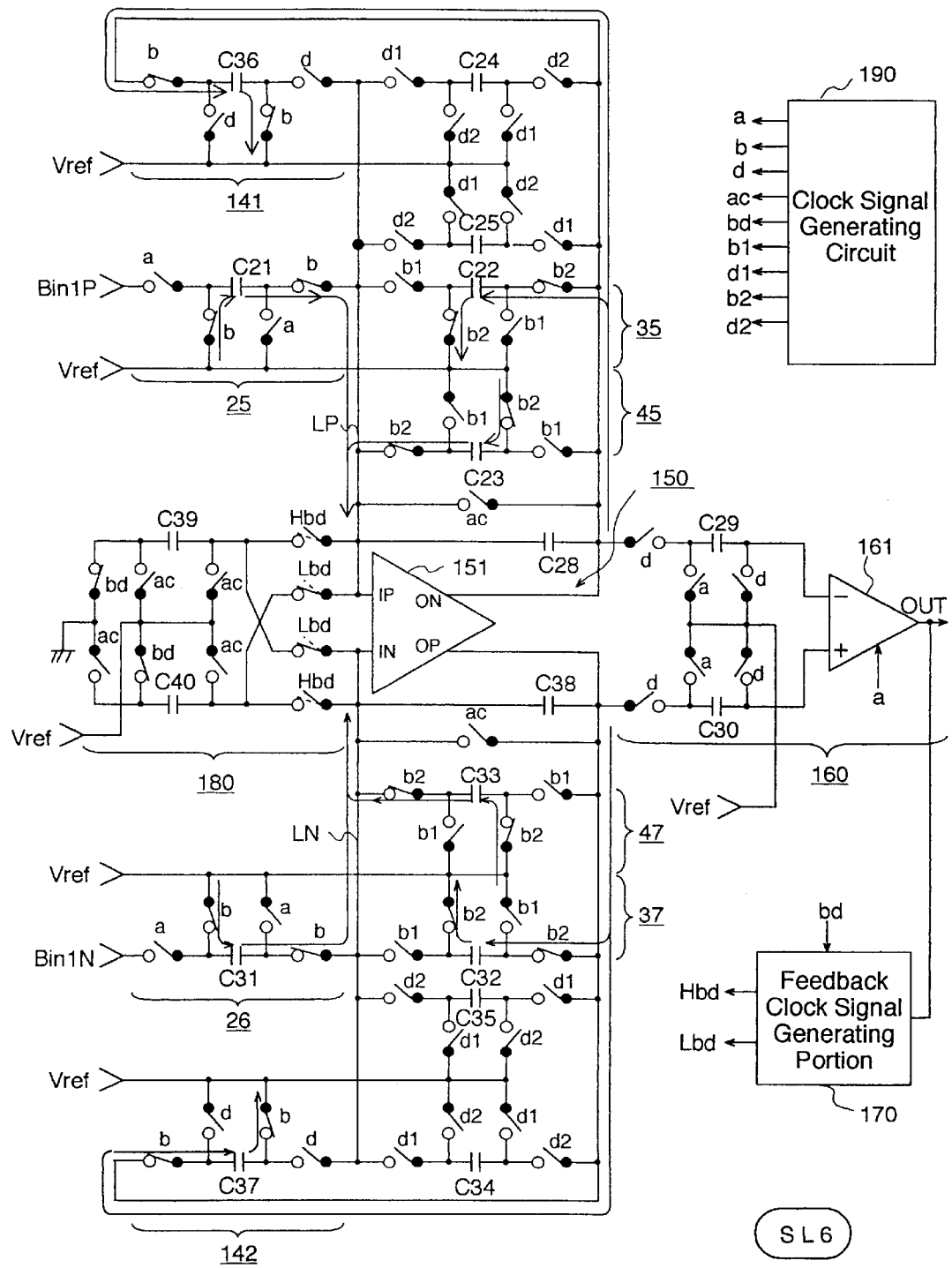
FIG. 27 is a circuit diagram illustrating an operational condition of the A/D converter shown in FIG. 19.

During the time slot SL6, only the clock signal b, bd and b2 are high, but the other clock signals are not. According to the output of the clock signals, the condition of the analog switches becomes as shown in FIG. 27; the following operation is conducted in the A/C converter.

a. In the input switched capacitor portions 25 and 26, the electric charges held in the capacitors C21 and C31 are supplied into the positive phase input line LP and the negative phase input line LN, respectively, under the condition that the polarities thereof are inverted.

b. In the feedback clock signal generating portion 170, when the output digital signal "OUT" is "0", the clock signal Hbd is outputted, while in case the signal "OUT" is "1" the clock signal Lbd is outputted.

c. In the one bit DAC portion 180, the feedback analog signal corresponding to the output digital signal "OUT" is generated according to the clock signal Hbd or Lbd, and the feedback analog signal is given to the positive phase input line LP and the negative phase input line LN, respectively.

d. In the second integral calculus memory portions 45 and 47, the electric charges held in the capacitors C23 and C33 are supplied into the positive phase input line LP and the negative phase input line NP, respectively, under the condition that the polarities thereof are inverted. The electric charges held in these capacitors have been given from the integrating portion 150 during the time slot SL2 of the previous sampling period TS$_i$; the charges correspond to the integral calculus of: the first integrating process of the previous sampling period TS$_i$.

e. In the integral calculating portion 150, since the initializing analog switches S511 and S512 are opened, the above mentioned signals, which are supplied from the positive phase input line LP and the negative phase input line LN, are integrated. As a result, the integral calculus of the first integrating process of the previous sampling period TS$_i$ and the input analog signal, which is taken into the portion 150 during the time slot SL5, are added to each other; the signal, which is obtained by subtracting the feedback analog signal from the added result, is obtained as an integral calculus of the first integral calculating process in the current sampling period TS$_{i+1}$. The voltage corresponding to the thus obtained integral calculus is outputted to the positive phase output line MN and the negative phase output line MN from the differential amplifier 151.

f. In the first integral calculus memory portions 35 and 37, the electric charges corresponding to the thus obtained integral calculus for the first integrating process are also held.

g. In the integral calculus transferring portions 141 and 142, the voltages corresponding to the integral calculus of the first integral calculating process are also held.

h. In the one bit ADC portion 160, the voltage corresponding to the positive phase component of the integral calculus of the first integrating process supplied from the integrating portion 150 is held in the capacitor C29 and the negative phase component thereof in the capacitor C30.

As stated above, the process during the time slot SL6 is as substantially the same as that during the time slot SL2 of the sampling period TS$_i$, but the allotment of the first integral calculus memory portions 35 and 37 is replaced by that of the second integral calculus memory portions 45 and 47.

(7) Time Slot SL7

Figure 28:
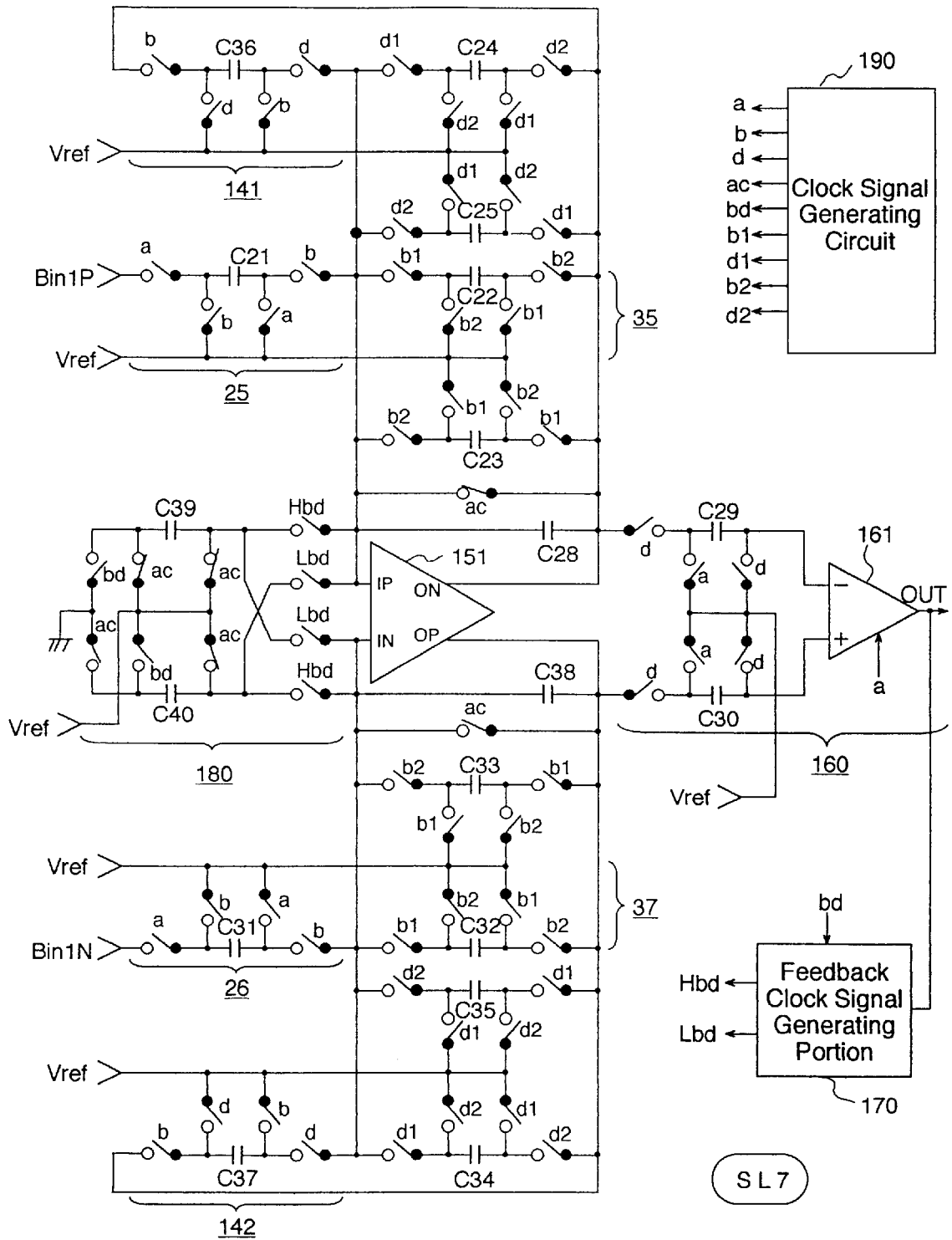
FIG. 28 is a circuit diagram representing an operational condition of the A/D converter shown in FIG. 19.

During the time slot SL7, the clock signal ac is high, and the other clock signals are not, the same as for the time slot SL3. According to the clock signal ac, the condition of the analog switches becomes as shown in FIG. 28, and the following operation is conducted in the A/D converter.

a. In the integrating portion 150, the initializing analog switches S511 and S512 electrically conduct, so that the integral calculus thereof becomes 0.

b. In the one bit DAC portion 180, the voltages applied on both terminals of the capacitor C39 become "zero" and the voltages on both terminals of the capacitor 40 is set at "Vref".

c. In the first integral calculus memory portions 35 and 37 and in the integral calculus transferring portions 141 and 142, all of the analog switches are opened. Therefore, the electric charges, which had been given during the time slot SL 6 are kept as they are in the capacitors C22, C32, C36 and C37.

(8) Time Slot SL8

Figure 29:
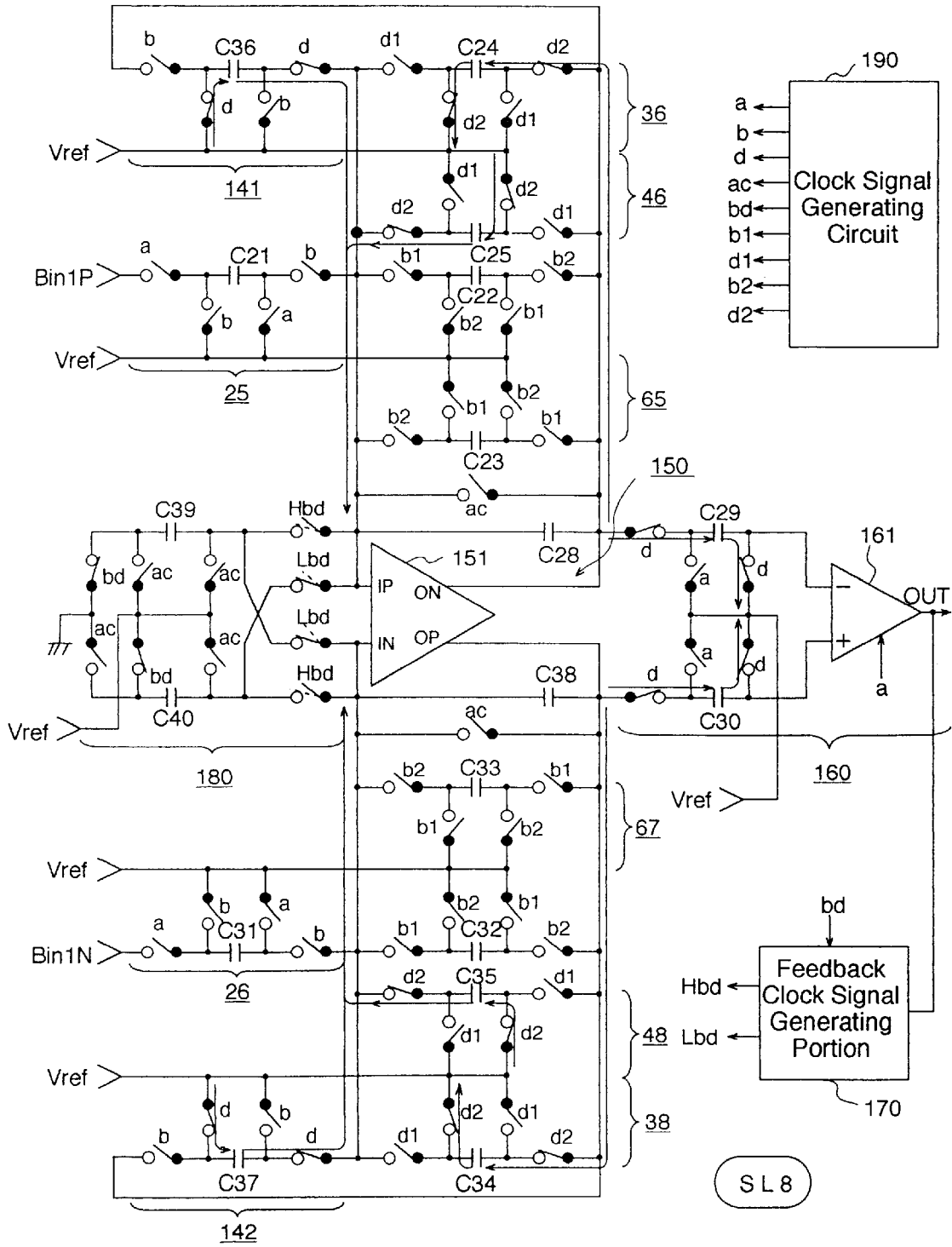
FIG. 29 is a circuit diagram representing an operational condition of the A/D converter shown in FIG. 19.

During the time slot SL8, the clock signals d, bd and d2 are high, but the other signals are not. Therefore, according to the outputs of the clock signals d, bd and d2, the condition of the analog switches becomes as shown in FIG. 29 and the following operation is conducted in the A/D converter.

a. In the integral calculus transferring portions 141 and 142, the electric charges held in the capacitors C36 and C37 are supplied to the positive phase input line LP and the negative phase input line LN, respectively, under the condition that the polarities thereof are inverted. The electric charges held in these capacitors correspond to the integral calculus of the first integrating process during the current sampling period TS$_{i+1}$.

b. In the feedback clock signal generating portion 170, when the output digital signal is "0", the clock signal Hbd is outputted, while the digital signal is "1" the clock signal Lbd is outputted.

c. In the one bit DAC portion 180, a feedback analog signal corresponding to the output digital signal is given to the positive phase input line LP and the negative phase input line LN, respectively.

d. In the second integral calculus memory portions 45 and 47, the electric charge held in the capacitor C23 and C33 are supplied to the positive phase input line LP and the negative phase input line LN, respectively, under the condition that the polarities thereof are inverted. The electric: charges held in these capacitors correspond to the integral calculus of the second integrating process during the previous sampling period TS$_i$.

e. In the integrating portion 150, since the initializing analog switches S511 and S512 are opened, integrations are conducted for the signals supplied via the positive input line LP and the negative input line LN. As a result, the integral calculus of the second integrating process obtained in the sampling period TS$_i$ is added to the input analog signal for the first integrating process during the sampling period TS$_{i+1}$, and a value, which is obtained by subtracting the feedback analog signal from the adding result, is obtained as an integral calculus of the second integrating process during the current sampling period TS$_{i+1}$. The voltage corresponding to the thus obtained integrated calculus is outputted from the differential amplifier 151 to the positive phase output line MP and the negative phase output line MN, respectively.

f. In the first integral calculus memory portions 36 and 38, the electric charges corresponding to the integral calculus of the second integrating process are held in the capacitors C24 and C34.

g. The voltages corresponding to the positive phase component and negative phase component of the integral calculus of the second integrating process are supplied from the integrating portion 150 to the one bit ADC portion 160. These voltages are kept in the capacitors C29 and C30 of the one bit ADC portion 160. When the sampling period is changed to the time slot SL1 of the next sampling period, the voltage held in these capacitors are given to the comparator 161, and then the digital signal "OUT" is outputted.

In this manner, the process during the time slot SL8 is as substantially the same as that during the time slot SL4, except for that where the part of the first integral calculus memory portions 36 and 38 are replaced for the second integral calculus memory portions 46 and 48.

Thereafter, the above-explained processes in the time slots SL1 to SL8 are repeated so that each process for the second order delta-sigma modulation, which is shown in FIG. 21, can be carried out.

The present invention is not limited to the above embodiments, but many other modifications can be considered, for instance, as in the following.

(1) In the above-mentioned embodiments, a balanced analog signal is used, and the analog signal is integrated in the integrating portion composed of a differential amplifier. However, the construction can be modified so that a nonbalanced analog signal is integrated in a general type of integral calculator which does not have a differential amplifier.

(2) In the first embodiments, the analog signals of the first and second channels are simultaneously sampled in the input switched capacitor portions, however, it is possible to arrange so that the sampling timings thereof are deviated from each other.

(3) In the first embodiment, the effect can be obtained by the integrations for the first channel and the integrations for second channel being processed in accordance with the predetermined time slots. Therefore, as the operation of the integrations is guaranteed, the inputting style of the analog signals for the first and second channels can be altered other styles.

(4) It is also possible to arrange the configuration such that only one integral calculus memory portion is provided for every channel, and after the integrating process is conducted with the aid of the charges held in the integral calculus memory portion, the charge corresponding to the new integrated calculus is held in the integral calculus memory portion. In this case, it is necessary to have another time slot(s) for holding the charge corresponding to the new integrated calculus separated from the time slots for integrating process; however, such an advantage can be obtained that the number of the integral calculus memories is reduced to half.

(5) In the above-mentioned first embodiment, analog signals are converted into digital signals only for two channels. In the case of converting signals for more channels, the numbers of the input switched capacitors and the integral calculus memory portions to the channels might be provided, and the corresponding number of the time slots are required so as to satisfy the necessary converting processes for the channels.

(6) In the first embodiment, the analog signals for two channels are supplied from the outside. However, it is possible to arrange that the analog signals generated inside of the A/D converter are inputted into the A/D converter again via the input switched capacitor portions. For instance, it may be arranged such that the analog signal outputted onto the positive phase output line MP and the negative output line MN are inputted again via the switched capacitor portions. In this case, the integral calculations of the input analog signals are conducted twice to execute the second order delta-sigma modulation. The same arrangement can be applied for the third or more order delta sigma modulation.

(7) For the second embodiment, the following modifications can be considered. First of all, it may be possible to arrange the configuration such such that only one integral calculus memory portion is provided for every integrating process, and after the integrating process is conducted with the aid of the charges held in the integral calculus memory portion, the charge corresponding to new integrated calculus is held in the integral calculus memory portion. In this case, it is necessary to have another time slot(s) for holding the charge corresponding to the new integrated calculus separated from the time slots for integrating process; however, such an advantage can be obtained that the number of the integral calculus memories is reduced to half.

(8) In the second embodiment, there are provided integral calculus transferring portions for transferring the integral calculus between different type of integrating processes. However, it is possible to arrange the configuration such that the integral calculus memory portion also serves to transfer the integral calculus.

(9) In the case that three or more integral calculating processes should be carried out, the corresponding numbers of the integral calculating memory portions must be provided. It is considered that one integral calculus obtained by one integrating process is used in two or more integral calculating processes. In this case, such an arrangement may be given that integral calculus transferring portions corresponding to all of the plurality of integral calculating processes which use the relevant integral calculus are provided; the signals showing the relevant integral calculus are memorized in the integral calculus transferring portions to be transferred to the next plurality of integral calculating portions.

As stated above, according to the first embodiment, the integral calculating processes corresponding to the plurality of channels can be successively conducted by only one integral calculating means under time divisional controlling. Therefore, an A/D converter can be obtained where signals for a plurality of channels can be processed with a small circuit construction.

Further, according to the second embodiment, different kinds of integrating processes are successively executed by only one integral calculating means under time sharing controlling. Therefore, an A/D converter can be obtained where highly-ordered integrating processes are carried out with a small circuit construction.

What is claimed is:

1. An analog/digital converter for converting input analog signals for a plurality of channels into digital signals under a time sharing control system comprising:

an integrating means for integrating input signals to provide integrated calculus output signals;

a plurality of integral calculus memory means, each for storing the integrated calculus output signals for a corresponding channel;

a signal digitalizing means for converting the integrated calculus output signals into digital signals and successively outputting the digital signals for each channel;

a feedback analog signal generating means for converting the digital signals generated in said signal digitalizing means into feedback analog signals; and a switching means, responsive to said time sharing control system, for initializing said integrating means, for selectively supplying said input analog signals, said integral calculus output signals stored in one of said integrating calculus memory means and said feedback analog signals as the input signal to said integrating means, and for supplying the integrated calculus output signal for a particular channel to the corresponding one of said integral calculus memory means.

2. An analog/digital converter according to claim 1, wherein said integral calculus memory means comprises at least two capacitors for storing said integrated calculus output signal; and wherein said switching means (i) transfers said integrated calculus output signal for a first channel from one of the capacitors of the integral calculus memory means to said integrating means as the input signal, and (ii) simultaneously transfers said integrated calculus output signal for a second channel from said integrating means to another one of the capacitors in the integral calculus memory means.

3. An analog/digital converter according to claim 1 or 2, wherein said analog/digital converter further comprises an input switched capacitor means for sampling said input analog signal for each channel, and wherein said input analog signals, which are sampled at the same time by the input switched capacitor means, are successively supplied to said integrating means.

4. An analog/digital converter for converting input analog signals into digital signals by repeating a plurality of integrating processes in a successive manner under a time sharing control system said integrating processes being subject to execution and interruption under control of said time sharing control system, said analog/digital converter comprising:

an integrating means for integrating input signals to provide integrated calculus output signal;

integral calculus memory means for storing integrated calculus output signals; and a switching means for transferring an integrated calculus output signal to the integral calculus memory means at said interruption of said integrating process, for initializing said integrating means at said interruption, and for supplying the stored integrated calculus output signal from the integral calculus memory means to said integrating means at execution of said integrating process, and supplying signals in such a manner that when a particular integrating process includes an input analog signal as an object to be processed, the input analog signal is supplied to the integrating means, while, when the particular integrating process includes a result of another integrating process as an object to be processed, the integrated calculus output signal of said other integrating process is supplied from the integral calculus memory means to said integrating means.

5. An analog/digital converter for converting input analog signals into digital signals by repeating a plurality of integrating processes in a successive manner under a time sharing control system comprising:

an integrating means for executing a plurality of integrating processes in a successive manner;

a plurality of integral calculus memory means for memorizing integral calculus signals showing the integrated results obtained in said integrating means at every integrating process;

an integral calculus transferring means for transferring an integral calculus between different kinds of integrating processes, in which when a previously calculated integrated result is included in the objects to be processed in a following integrating process, an integral calculus signal showing said previously calculated integrated result is stored in the integral calculus transferring means; and a switching means where when said integrating process is interrupted, an integral calculus signal showing the integrated result of the integrating process at the time of the interruption is stored in a relevant integral calculus memory means, and the integrated result of the integrating process is initialized; when a relevant integrated result is used in the following integrating process, an integral calculus signal showing the relevant integrated result is stored not only in the relevant integral calculus memory means but also in said integral calculus transferring means so as to supply the integral calculus signal of the relevant integrating process from the relevant integral calculus memory means to the integrating means each time the integrating process is executed; and when the integrating process includes an input analog signal as an object to be processed, the input analog signal is supplied to the integrating means, while, when the integrated result of the previously conducted integrating process is included in the objects to be processed in the relevant integrating means, the integral calculus signal of the previously executed integrating process is supplied from the integral calculus transferring means to the integrating means.

6. An analog/digital converter according to claim 4 or 5, wherein said converter further comprises an input switched capacitor means for sampling said input analog signal for each channel, and said input analog signals, which are sampled at the same time by the input switched capacitor means, are successively supplied to said integrating means.

* * * * *